(12) United States Patent
Sun et al.

(10) Patent No.: US 10,979,270 B2
(45) Date of Patent: Apr. 13, 2021

(54) SCALABLE SYNTHESIS OF SIGNALS OF HIGH SYMBOL RATE USING LOWER SYMBOL RATE DSPS

(71) Applicant: Infinera Corporation, Sunnyvale, CA (US)

(72) Inventors: Han Sun, Sunnyvale, CA (US); Avid Lemus, Sunnyvale, CA (US); Ahmed Awadalla, Sunnyvale, CA (US); Kuang-Tsan Wu, Ottawa (CA)

(73) Assignee: Infinera Corporation, San Jose, CA (US)

(*) Notice: Subject to any disclaimer, the term of this patent is extended or adjusted under 35 U.S.C. 154(b) by 0 days.

(21) Appl. No.: 16/298,455

(22) Filed: Mar. 11, 2019

(65) Prior Publication Data

US 2019/0280910 A1    Sep. 12, 2019

Related U.S. Application Data

(60) Provisional application No. 62/641,031, filed on Mar. 9, 2018.

(51) Int. Cl.
| | |
|---|---|
| H04L 27/00 | (2006.01) |
| H04L 27/26 | (2006.01) |
| H04L 25/02 | (2006.01) |
| H04L 5/00 | (2006.01) |
| H03H 17/06 | (2006.01) |
| H04L 27/12 | (2006.01) |

(52) U.S. Cl.
CPC ......... H04L 27/2634 (2013.01); H03H 17/06 (2013.01); H04L 5/001 (2013.01); H04L 25/0212 (2013.01); H04L 27/122 (2013.01)

(58) Field of Classification Search
CPC ... H04L 27/2634; H04L 27/122; H04L 5/001; H04L 25/0212; H03H 17/06
USPC ........................................ 375/232, 260, 295
See application file for complete search history.

(56) References Cited

U.S. PATENT DOCUMENTS

| | | | | |
|---|---|---|---|---|
| 2003/0154494 | A1* | 8/2003 | Sage | H04N 7/17309 725/120 |
| 2009/0207926 | A1* | 8/2009 | Huang | H04L 27/265 375/260 |
| 2009/0323724 | A1* | 12/2009 | Crockett | H03D 7/00 370/497 |
| 2014/0211886 | A1* | 7/2014 | Ghannouchi | H04B 14/062 375/297 |
| 2014/0240319 | A1* | 8/2014 | Syed | H04N 21/23436 345/428 |

(Continued)

*Primary Examiner* — Don N Vo
(74) *Attorney, Agent, or Firm* — David L. Soltz

(57) ABSTRACT

Methods, systems, and apparatus, including computer programs encoded on computer storage media, for transmitting signals with a high data rate. In some implementations, an apparatus includes a first digital signal processor outputting first data at a first data rate. A second digital signal processor outputting second data at a second data rate. A filter circuitry receiving and up-sampling the first and second data. Additionally, the apparatus includes a combiner circuit that receives the first up-sampled data and the second up-sampled data, the combiner circuit combining the first and second up-sampled data to provide a multiplexed output, the multiplexed output having a third data rate that is greater than the first data rate or the second data rate.

9 Claims, 9 Drawing Sheets

(56) References Cited

U.S. PATENT DOCUMENTS

2015/0008962 A1* 1/2015 Blyth .................... H03F 1/0227
                                                        327/59
2017/0149507 A1* 5/2017 Le Taillandier De Gabory ..........
                                                    H04L 27/2623

* cited by examiner

SCALABLE SYNTHESIS OF SIGNALS OF HIGH SYMBOL RATE USING LOWER SYMBOL RATE DSPS

CROSS REFERENCE TO RELATED APPLICATIONS

This application claims the benefit of U.S. Provisional Patent Application No. 62/641,031, filed Mar. 9, 2018, which is incorporated herein by reference in its entirety.

BACKGROUND

This specification relates generally to transmitting signals with high data rates.

Many systems have increased symbol rate and associated data rate in order to reduce the cost of transmission and bandwidth, accordingly. However, the generation and detection of such systems are not trivial designs.

SUMMARY

In some implementations, a transmitter and receiver system synthesizes various data rate signals to produce a high data rate signal. The techniques disclosed herein can enable the system to effectively generate, transmit, detect, and process high data rate signals. In particular, the techniques incorporated allow for digital multiplexing various lower data rate signals to synthesize a high date signal. In some implementations, the rate of the high data rate signal becomes a multiplicative factor of the number of low data rate signals multiplexed together and the data rate (e.g., baud rate or symbol rate) corresponding to each of the low data rate signals. This system is flexible in that N number of low data rate signals can be multiplexed together to generate a desired high data rate signal. Additionally, the design of this system is flexible and scalable such that the N number of low data rate signals can range from 1 to N, in order to meet a user's desired output high data rate. This system is cost-effective considering the simplicity of incorporating more low data rate signals simply by adding another input to the digital multiplexer. This design can also be used for future transmission designs, in order to increase the data rate of a currently designed system that produces a high data rate output. Thus, reducing overall design effort and time for pushing this design to market.

In some implementations, the system can multiplex one or more low data rate systems to synthesize a high data rate output. The high data rate output can be utilized in optical networks as well as radio frequency (RF) networks. For example, the system may multiplex two 33 giga-baud (GB) signals to output a signal with a 66 GB symbol rate (e.g., Gbaud/s or GSamples/s). In another example, the system may multiplex three 33 Gbaud signals to output a signal with a 99 Gbaud data rate. Each low data rate system can be combined together by digital multiplexing each of their outputs to achieve the higher data rate synthesized output.

The system can include a transmitter and a receiver. The transmitter can include multiple path engines that process input data and combine together to produce the synthesized high data rate output. For example, one of the path engines of the transmitter can include a forward error correction (FEC) encoder, an interleaver, a transmitter digital signal processors (DSPs), and a digital-to-analog converter (DAC). The transmitter can additionally include a gain-sharing module shared across each of the path engines. The transmitter can include a digital multiplexer and a modulator.

The transmitter may receive input data at each of its path engines and perform multiple tasks on each path engine. For example, along one path engine, the transmitter may receive input data, encode the input data using the FEC encoder, interleave the encoded data across another path engine using the gain-sharing module, and interleave the output of the gain-sharing module. Additionally, along the path engine, the transmitter can map interleaved output to a set of subcarriers with a first symbol rate, apply a spectral shaping to each of the subcarriers, and generate input values based on the spectral shaping of each subcarriers. The transmitter can multiplex input values from each path engine are to generate combined data. The DAC receives the combined data and generates voltage signals based on the combined data. The modulator generates an output signal using a local oscillator and the generated voltage signals that includes the subcarriers. Then, the modulator outputs the output signal. The transmitter outputs the output signal over a transmission channel.

Similar to the transmitter, the receiver can include multiple path engines to detect and process the received data over the channel. For example, one of the path engines of the receiver can include an analog-to-digital converter (ADC), a receiver digital signal processor, a de-interleaver, and a FEC decoder. The receiver can additionally include a digital de-multiplexer and a demodulator. In addition, the receiver can include a gain-sharing module shared across each of the path engines of the receiver.

The receiver may receive the signal output by the transmitter over the transmission channel. The receiver's demodulator can include a detector that receives the signal that includes a set of subcarriers modified by the transmission channel, and convert the set of subcarriers to a set of voltage signals. Each ADC can receive the set of voltage signals from the detector, and generate digital samples based on the set of voltage signals. The digital de-multiplexer can receive the set of voltage signals and route output to the various path engines. The receiver digital signal processor processes each of the digital samples and maps the digital samples to output data (e.g., bits or bytes). The de-interleaver de-interleaves the output data according to an interleave pattern set by the interleaver at the transmitter. The second gain-sharing module de-interleaves the data across the path engines. The output of the second gain-sharing module is provided to the FEC decoder. The FEC decoder receives the output from the second gain-sharing module, decodes the encoded data to produce output data, and outputs the data.

In general aspect, an apparatus includes: a first digital signal processor outputting first data at a first data rate; a second digital signal processor outputting second data at a second data rate; filter circuitry receiving and up-sampling the first and second data; and a combiner circuit that receives the first up-sampled data and the second up-sampled data, the combiner circuit combining the first and second up-sampled data to provide a multiplexed output, the multiplexed output having a third data rate that is greater than the first data rate or the second data rate.

Particular implementations may include one or more of the following features. For example, in some implementations, the apparatus includes wherein the filter circuitry comprises a finite-impulse response (FIR) circuit.

In some implementations, the apparatus includes wherein the first data rate is equal to the second data rate.

In some implementations, the apparatus includes wherein the first data comprises a first plurality of subcarriers, the second data comprises a second plurality of subcarriers, and the multiplexed output comprises a third plurality of subcarriers, the third plurality of subcarriers including one or more subcarriers from at least one of the first plurality of subcarriers or the second plurality of subcarriers.

In some implementations, the apparatus includes wherein the third plurality of subcarriers includes the one or more subcarriers that are orthogonal to one another.

In some implementations, the apparatus includes wherein the first data, the second data, and the multiplexed output are digital representations of the first plurality of subcarriers, the second plurality of subcarriers, and the third plurality of subcarriers, respectively.

In some implementations, the apparatus further includes a multiplier receiving the up-sampled first data and multiplying the up-sampled first data by a plurality of complex coefficients.

In some implementations, the apparatus includes wherein the first data rate is 33 GHZ and the second data rate is respectively one of 33, 66, 99, 132, or 198 GHz.

In some implementations, the apparatus further includes a transmitter including a plurality of path engines; a gain-sharing module, wherein the gain-sharing module is connected to the plurality of path engines and each path engine of the plurality of path engines comprises: the first digital signal processor configured to receive input data and output the first data at the first data rate; and a digital-to-analog converter (DAC) configured to receive the multiplexed output from the combiner circuit and output analog representations of the multiplexed output; the combiner circuit configured to receive the first data from the first digital signal processor and the second data from the second digital signal processor and output the multiplexed output; and a modulator configured to generate a modulated output based on an analog representation of the multiplexed output.

In some implementations, the apparatus includes a laser generating an optical signal; and the modulator receiving the analog representation of the multiplexed output and the optical signal and modulating the optical signal based on the analog representation of the multiplexed output to generate a modulated optical signal that comprises a plurality of subcarriers.

In some implementations, each of the path engines further includes: a forward error correction encoder configured to receive the input data and output encoded data to the gain-sharing module; and an interleaver configured to receive a split portion of the encoded data from the gain-sharing module and output interleaved data.

In some implementations, the gain-sharing module is configured to: receive the encoded data from the forward error correction encoder from each of the path engines of the plurality of path engines: and disperse, according to a dispersing arrangement, the encoded data across the plurality of path engines, to the interleaver of each of the path engines of the plurality of path engines.

In some implementations, the second data rate is a multiplicative factor of the first data rate and a number of the path engines from the plurality of path engines.

In some implementations, the combiner circuit further includes: for each path engine in the plurality of path engines: an up-sampling filter configured to shape a spectrum for each subcarrier of the first data; a multiplier configured to multiply each subcarrier of the first data by a carrier frequency surrounding a frequency of the first data rate, such that each subcarrier of the multiplexed output occupies a non-overlapping frequency band; and a summer configured to sum the output from each of the multipliers and output digital representations of the multiplexed output.

In some implementations, the filter circuitry is configured to up-sample each subcarrier of the first data by a number equivalent to the number of the path engines.

In some implementations, the plurality of path engines includes a first plurality of path engines and the gain-sharing module includes a first gain-sharing module, and further includes: a receiver, including: a de-modulator configured to: receive the plurality of subcarriers at the second data rate; receive a local oscillator signal from a local oscillator; combine the local oscillator signal and the plurality of subcarriers to generate a resulting signal; and output the resulting signal to a detector; the detector configured to provide a set of voltage signals based on the resulting signal; a second plurality of path engines, wherein each path engine of the second plurality of path engines comprises: an analog-to-digital converter (ADC), each ADC configured to receive the set of voltage signals from the detector and generate, using the set of voltage signals, digital representations of signals to provide to a de-multiplexer; a receive digital signal processor configured to receive fourth subcarriers from the de-multiplexer at the first data rate and output digital data; a de-interleaver configured to receive the digital data and output de-interleaved data; and a forward error correction decoder configured to receive arranged de-interleaved data from a second gain-sharing module and output bit data; and the de-multiplexer that is configured to receive the digital representations of signals from each ADC in the plurality of second path engines and output the fourth subcarriers to each path engine of the second plurality of path engines.

In some implementations, the apparatus includes a second gain-sharing module that is connected to the second plurality of path engines and is configured to: receive the de-interleaved data output by the de-interleaver of each of the path engines of the second plurality of path engines; and re-arrange the de-interleaved data according to a dispersing arrangement performed by the first gain-sharing module.

Implementations of the above techniques include methods, apparatus, systems and computer program products. One such computer program product is suitably embodied in a non-transitory machine-readable medium that stores instructions executable by one or more processors. The instructions are configured to cause the one or more processors to perform the above-described actions.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
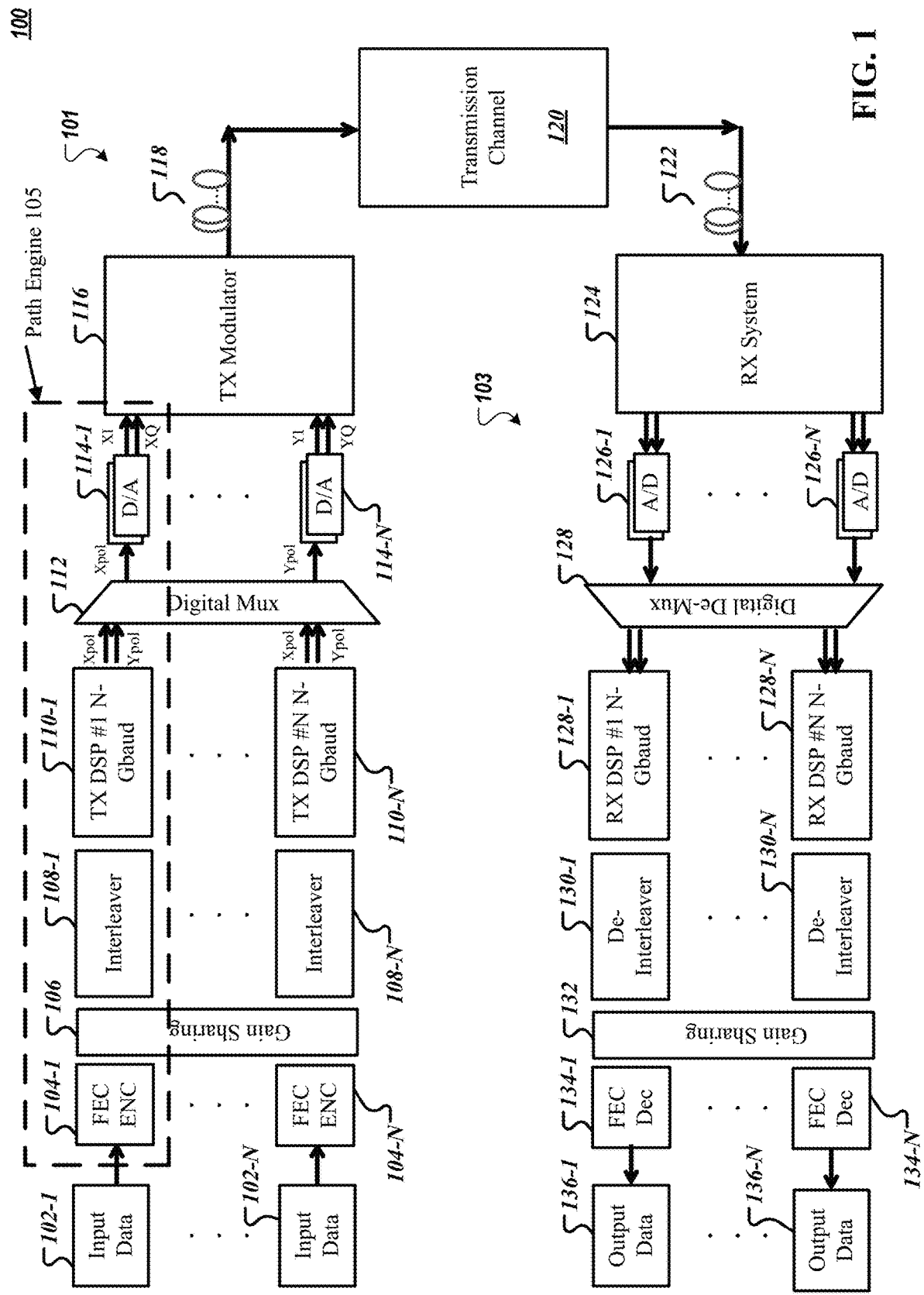
FIG. 1 is a block diagram that illustrates an example of a system for synthesizing low data rate signals to produce a high data rate signal.

In some implementations, a system can be implemented to synthesize one or more low data rate (or symbol rate) signals to produce a high data rate signal. For example, this system can be applied in a radio frequency environment as well as in an optical communications environment. This system can generate from input data, a set of subcarriers with a first symbol rate, multiplex the set of subcarriers, to produce output subcarriers at a desired second symbol rate. The second symbol rate can be a factor of the first symbol rate and a number of path engines found in the transmitter. The higher the synthesized rate, the higher the first symbol rate and a larger number of path engines required to be multiplexed.

In optical communication systems, wavelength division multiplex (WDM) are systems in which multiple optical signals, each having a different wavelength, can be combined into a single optical communication channel (e.g., an optical fiber) using an optical multiplexer circuit (referred to as a "multiplexer"). These optical communication systems can include a transmitter circuit, such as a transmitter (TX) photonic integrated circuit (PIC). The TX PIC can include a laser system. The laser system can provide a laser signal associated with each wavelength to a modulator configured to modulate the output of the laser. Additionally, the TX PIC can include a multiplexer to combine each of the modulated outputs (e.g., to form a combined output or WDM signal) and a gain-sharing module to disperse the bit error rate effects due to path loss on the transmission channel across the subcarriers in the time domain.

In some implementations, the WDM communication system also includes a receiver, such as a receiver PIC and an optical de-multiplexer circuit. The de-multiplexer circuit is configured to receive the combined output from the receiver and de-multiplex the combined output to provide individual signals (e.g., set of subcarriers) to the various path engines. Additionally, the receiver can include additional receiver components, such as an ADC, an FEC decoder, and an interleaver, to name a few examples, to convert the optical signals into voltage values and generate de-interleaved and decoded data from the voltage values.

A PIC integrates multiple photonic functions on a single integrated circuit device. In some implementations, the PIC can be fabricated in a manner similar to electronic integrated circuits, but may be fabricated using one or more of a variety of material types, such as for example, silica on silicon, silicon on insulator, or various polymers, and other semiconductor materials, which are used to make semiconductor lasers, such as GaAs and InP.

The transmitter (TX) and receiver (RX) PICs, in an optical communication system, may support communications over a wide range of wavelength channels. For example, a pair of TX/RX PICS may support ten channels, each spaced apart by, for example, 50 GHz to 200 GHz, depending upon the design of the system. The set of channels supported by the TX and RX pics can be referred to as the channel "grid" for the PICs. Channel grids for TX/RX PICs may be aligned to standardized frequencies, such as those published by the Telecommunication Standardization Sector (ITU-T). The set of channels supported by the TX and RX PICs may be referred to as the ITU frequency grid for the TX/RX PICs. The spacing, between the channels, may be less than 200 GHz, for example, in order to pack the channels together to form a super channel.

In typical radio frequency (RF) communication systems, data is typically transferred using modulation schemes and detected/received using a local oscillator. For example, a transmitter in RF communication systems typically receives a set of source data (e.g., bits or bytes), encodes the data, modulates the encoded data using one or more modulation schemes, power amplifies the modulated data, and transmits the data. Additionally, the RF transmitter typically includes a local oscillator, a modulator, a power amplifier, and an antenna. The local oscillator generates a carrier signal. The modulator modulates the carrier signal using the message data (e.g., the encoded data). For example, the modulator can employ one or more modulation schemes such as amplitude shift keying (ASK), frequency shift keying (FSK), and phase shift keying (PSK), to name a few examples. The power amplifier amplifies the modulated signal to a desired power level to transmit the signal without suffering from complete signal loss over the transmission channel. The antenna radiates the modulated signal as an electromagnetic wave at the desired power level.

Additionally, typical RF communication systems include various components to receive and process the signal transmitted by the antenna. One example of a typical RF communication system's receiver includes a super heterodyne receiver. A super heterodyne receiver includes an antenna, an RF filter, an RF amplifier, a local oscillator, a mixer, an IF amplifier, and a detector. The antenna receives the electromagnetic wave of the modulated signal. The RF filter prevents interference from any other radio signals besides the desired radio signal. The RF amplifier increases the gain (e.g., power) of the recovered signal. The local oscillator generates an intermediate frequency (IF). The mixer combines the IF with the recovered signal to convert the recovered signal to low IF for band-pass filtering. The detector demodulates the recovered signal using a scheme used to modulate the signal at the transmitter. The demodulated signal is provided as output.

FIG. 1 is a block diagram that illustrates an example of a system 100 for synthesizing low data rate signals to produce a high data rate signal. System 100 includes a transmitter 101, a transmission channel 120, and a receiver 103. In particular, the transmitter 101 can include one or more path engines (e.g., such as path engine 105), a gain-sharing module 106 spread across each of the path engines, a digital multiplexer 112, and a TX modulator 116. In some implementations, the TX modulator 116 can include a dual polarized TX PIC modulator for optical communication systems. Alternatively, the TX modulator 116 may include something other than a TX PIC, such as a modulator for transmitting data using a carrier signal with amplitude, phase, or frequency modulation, to name a few examples.

In some implementations, the transmitter 101 can include one or more path engines that generate a low data rate signal. In particular, each path engine can include input data, an FEC encoder, an interleaver, a transmitter digital signal processor (DSP), and a DAC. Additionally, a gain-sharing module can be shared across each path engine to perform gain-sharing functions for the transmitter 101. The gain-sharing module can include circuitry that connects to each path engine to perform the following functions, as described below. Additionally, the gain-sharing module can include software for performing the functions described below. For example, as illustrated in system 100, a path engine can include an FEC encoder 104-1, an interleaver 108-1, a TX DSP 110-1, and a DAC 114-1. In another example, a second path engine can include input data 102-2, an FEC encoder 104-2, an interleaver 108-2, a transmitter DSP 110-2, and a DAC 114-2. The transmitter 101 can include N number of path engines. Additionally, a portion of the gain-sharing module 106 is shared across each of the path engines. In particular, the gain-sharing module 106 is shared between the FEC encoder and the interleaver for each path engine. Additionally, each path engine can include one or more amplifiers to increase the gain of the transmit signal to ensure the signal is not lost due to the effects of the transmission channel 120.

The transmitter 101 can additionally include a digital multiplexer 112. The digital multiplexer 112 receives data from each of the path engines and provides combined data output to each of the DACs 114-1 through 114-N. In some implementations, the transmitter 101 may include fewer number of DACs 114 than the number of path engines. Alternatively, the transmitter 101 may include the same number of DACs 114 as the number of path engines. The DACs provide data output to the TX modulator 116. In response, the TX modulator 116 transmits subcarriers 118 to the transmission channel 120.

Each path engine shown in system 100 in the transmitter 101 can receive the input data 102. For example, path engine 1 receives input data 102-1. The input data can include bit stream or byte stream, for example, which is to be transmitted over the transmission channel 120. In some implementations, the input data 102 provided to each FEC encoder 104 is different from one another. For example, the input data 102-1 is a different set of data compared to the input data 102-N.

The FEC encoders (collectively 104) receive the input data and encode the input data using one or more encoding algorithms. For example, the encoding algorithms can include a Viterbi algorithm, a reed-solomon algorithm, a turbo coding scheme, or another convolutional encoding scheme. The FEC encoders 104 can output the encoded data to the gain-sharing module 106.

In some implementations, the gain-sharing module 106 is spread across each of the path engines in the transmitter 101. In other implementations, the gain-sharing module 106 is used only on one path engine or a desired number of path engines, where the desired number of path engines is less than the total number of path engines. In particular, the goal of the gain-sharing module 106 is to provide robustness against high bit error rate on any one particular engine. The gain-sharing module 106 receives the data from each of the FEC encoders 104 on the particular path engine, mixes the received data, and outputs the mixed data to different path engine. For example, the gain-sharing module 106 can mix the data to different path engines based on random assignments. Alternatively, the gain-sharing module 106 can mix the data to different path engines based on a designated assignment. For example, the gain-sharing module 106 may receive a block of data from the FEC encoder 104-1 and a block of data from the FEC encoder 104-2. The gain-sharing module 106 can provide a first portion of the block of data from the FEC encoder 104-1 to the interleaver 108-2 and the second portion of the block of data from the FEC encoder 104-1 to the interleaver 108-1. Similarly, the gain-sharing module 106 can provide a first portion of the block of data from the FEC encoder 104-2 to the interleaver 108-1 and the second portion of the block of data from the FEC encoder 104-2 to the interleaver 108-2.

In another example, the gain-sharing module 106 can perform similar splitting features for N number of path engines. If the transmitter 101 has three path engines, then the gain-sharing module 106 can split the data received from a particular FEC encoder to another path engine. For example, in the example with the gain-sharing module 106 receiving data from three path engines, the gain-sharing module 106 can provide one-third portion of the block of data from the FEC encoder 104-1 to the interleaver 108-2, another one-third portion of the block of data from the FEC encoder 104-2 to the interleaver 108-3, and the last one-third portion of the block of data from the FEC encoder 104-3 to the interleaver 108-1.

In some implementations, the gain-sharing module 106 may split a block of data received based on the number of path engines in the transmitter 101. For example, if the transmitter 101 has three path engines, then the gain-sharing module 106 can split input data 102-1 and each of the other input data streams (e.g., 102-2 and 102-3) into three parts. Alternatively, the gain-sharing module 106 may not split the blocks of input data, but rather assign each block of input data to another path engine. For example, if the transmitter 101 includes two path engines, then the gain-sharing module 106 can provide each block of input data 102-1 from the first path engine to the interleaver 108-2 and provide each block of input data 102-2 from the second path engine to the interleaver 108-1. Still, other means are possible, where every other block of data is provided to different path engines. By splitting the data stream to a different path engine, the system 100 can provide robustness against bit error rates. In particular, by splitting the data stream, each path engine can see the same bit error rate on a corresponding path engine of the receiver 103. If the transmitter 101 does not split data across different path engines, a particular path engine at the receiver 103 may experience a higher bit error rate than the other path engines. This will be further explained below.

The output of the gain-sharing module 106 is provided to an interleaver, such as interleaver 108-1, on each path engine. In some implementations, the interleavers (collectively 108) receive the gain-shared data and perform an interleave operation on the gain-shared data. The purpose of interleaving is to split the gain-shared data across different sets to improve the bit error rate of those data sets. The interleavers 108 is performed in addition to the gain-sharing module 106 to further improve the bit error rate as the data is transferred across the transmission channel 120. For example, the interleavers 108 may perform a random interleaving function where a data block is moved at random based on a permutation and/or a random seed value. In another example, the interleavers 108 may perform an algebraic interleaving function where a data block is moved based on a permutation that has been algebraically derived. Each interleaver 108 in the transmitter can perform a different interleaving function. However, the de-interleavers at the receiver 103 must have the knowledge of what interleaving function was performed for a particular path engine in order to properly de-interleave the data corresponding to a similar path engine on the receiver 103. This will be further explained below.

The path engines also include a transmitter (TX) digital signal processor (DSP) (collectively 110). The TX DSPs receive the interleaved data from the interleavers 108 and produce subcarriers. For example, the TX DSP 110-1 receives interleaved data from the interleaver 108-1 and generates multiple subcarriers from the interleaved data. In particular, the TX DSPs maps the streams of interleaved data onto each of the subcarriers, applies spectra shaping to each of the subcarriers to be resistant to channel effects from the transmission channel 120, and obtains, based on the spectral shaping of each of the subcarriers, a sequence of values to apply to the digital multiplexer 112. For example, the sequence of values can be a set of X-polarity values and a set of Y-polarity values. These values can correspond to real and imaginary components of a subcarrier in the time-domain. In some implementations, each TX DSP 110 may generate a set of subcarriers using time domain filtering and frequency shifting by multiplication in the time domain. Alternatively, the TX DSP 110 may apply other modulation schemes or shaping of subcarriers for transmission.

In some implementations, a TX DSP 110 may produce digital subcarriers at a desired symbol rate. The desired symbol rate can be based on desired performance characteristics of the TX DSP and/or computational complexity of the TX DSP. For example, the components within the TX DSP 110 may produce digital subcarrier samples at a rate of 33 Gbaud. In another example, the TX DSP 110 may output two sets of subcarriers (e.g., X-polarity samples and Y-polarity samples) of 33 Gbaud each. Alternatively, each subcarrier output may include a subset of the total symbol rate, such as 16.5 Gbaud, to give a total of 33 Gbaud. Other symbol rate values are possible, such as 66 Gbaud, 99 Gbaud, 132 Gbaud, or 198 Gbaud, or higher, to name a few examples.

The digital multiplexer 112 receives the integer values from each of the path engines (e.g., in particular, the TX DSP 110s) and output signals to the DACs 114. In particular, the digital multiplexer 112 may combine multiple integer values into a single output signal. For example, the digital multiplexer 112 may receive real (e.g., X-polarity) values and imaginary (e.g., Y-polarity) values from each of the path engines and output a single output containing both the real and imaginary values. Alternatively, the digital multiplexer 112 may include multiple outputs (e.g., less than the number of outputs from the path engines), such as two. One output of the multiple outputs can include the real values and the other output of the multiple outputs can include the imaginary values.

In some implementations, in the optical communications system, the digital multiplexer 112 can include an arrayed wave-guide grating (AWG) or another multiplexing device. The output of the multiplexer can include a single optical output signal, such as a WDM signal, for example. In some implementations, the digital multiplexer 112 may combine the subcarrier signals from each of the TX DSPs 110 in such a way as to produce a polarization diverse signal (e.g., such as a WDM signal). A corresponding waveguide may output the WDM signal on an optical fiber.

In some implementations, the DACs 114-1 through 114-N shown on each path engine receives the output from the digital multiplexer 112. In particular, the DAC, such a DAC 114-1 can receive the sequence of integers from the digital multiplexer 112 and based on the sequence of assigned integers, generate voltage signals to apply to the TX modulator 116. For example, the higher the integer, the higher the voltage signals. If the DAC 114-1 receives an integer of one, the DAC 114-1 can generate a voltage of +5 volts. Alternatively, other integers and corresponding voltage values can be used.

In some implementations, the transmitter 101 may include one DAC 114 that receives the output of the digital multiplexer 112. In other implementations, the transmitter 101 may include a number of DACs 114 equivalent to the number of path engines. Yet, in other implementations, the transmitter 101 may include two DACs 114-1 and 114-2. The number of DACs can be based on the number of outputs provided by the digital multiplexer 112. In particular, the first DAC 114-1 can be used for the real integer values and the second DAC 114-2 can be used for the imaginary integer values. Alternatively, the first DAC 114-1 and the second DAC 114-2 can be used to convert other digital values to analog values.

In an optical communication system, the TX modulator 116 can be used to generate optical polarization signals for transmitting on an optical fiber. In this example, where the TX modulator 116 is used in an optical communication system, the TX modulator 116 can include a laser and an Mach-Zehnder modulator (MZM), for example. The laser can be used to provide an output optical light beam for transmitting the optical signal. The TX modulator 116 can receive the optical light beam from the laser and the voltage signals from the DACs (collectively 114), and can modulate the optical light beam from the laser using the values of the voltage signals. The modulated optical light beam can be transmitted as a multiple subcarrier output signal, such as multiple subcarriers 118.

Alternatively, the TX modulator 116 can be used to generate multiple subcarriers in an RF communication system. In this example, where the TX modulator 116 is used in an RF communication system, the TX modulator 116 can include a local oscillator, a modulator, an equalizer, an amplifier, a mixer, and an antenna. For example, the local oscillator generates an intermediate frequency signal, which is modulated with the data from the digital multiplexer 112. The TX modulator 116 then equalizes the modulated signal at IF which seeks to pre-empt the distortion incurred by the signal when transmitted through the transmission channel 120. For example, the TX modulator 116 may use a minimized mean square error (MMSE) equalizer, a zero forcing equalizer, or an adaptive equalizer, to name a few examples. The amplifier then amplifies the gain of the signal for transmission. The mixer then mixes the amplified signal located at the IF (intermediate frequency) to an RF frequency value for transmission. The antenna generates an electromagnetic wave to transmit the amplified signal at the RF frequency and outputs the electromagnetic wave to the transmission channel 120.

In some implementations, the TX modulator 116 generates multiple subcarriers 118 at a second data rate (e.g., or second symbol rate). The second data rate is a multiplicative factor of the first symbol rate corresponding to each of the TX DSPs 110 and the number of path engines. For example, if TX DSP 110-1 through 110-N has a symbol rate of 33 Gbaud and the transmitter 101 has two path engines, then the second data rate output by the TX modulator 116 is multiplicative factor of 33 Gbaud and two path engines, resulting in 66 Gbaud. Other examples include a different number of path engines. For example, if the TX DSP 110-1 through 110-N has a symbol rate of 33 Gbaud and the transmitter 110 has three path engines, then the second data rate output by the TX modulator 116 is 99 Gbaud; if the first symbol rate 33 Gbaud and the transmitter 110 has four path engines, then the second data rate output by the TX modulator 116 is 132 Gbaud. Other first symbol rates and different path engines (e.g., 1, 2, 3, 4, etc., path engines) are also possible. The previously mentioned first symbol rates, second symbol rates, and the number of path engines are exemplary only.

In some implementations, the multiple subcarriers 118 output by the TX modulator are orthogonal to one another to avoid interference. For example, the first subcarrier of the multiple subcarriers 118 and the second subcarrier of the multiple subcarriers 118 are orthogonal to one another by way of frequency separation. Similarly, the second subcarrier is orthogonal to the third subcarrier. The subcarriers are orthogonal to one another avoid a high bit error rate (BER) and interference from the data transmission. In other implementations, the characteristics of the system may desire to have a higher spectral efficiency. As such, the subcarriers may be shifted to avoid orthogonality and spectrally overlap one another. Although, this can cause a small BER penalty, the system overall gains a higher spectral (e.g., bandwidth) efficiency because less bandwidth is used to transmit the signal.

In some implementations, the transmission channel 120 can be an optical fiber in an optical communication system. In other implementations, the transmission channel 120 can be air, a coaxial cable, or another media in an RF communication system. The transmission channel 120 may introduce impairments and errors into the multiple subcarriers 118 that the receiver 103 can work to recover.

The receiver 103 can receive the subcarriers 122 over the transmission channel 120. The subcarriers 122 can be received at a particular frequency that the subcarriers 118 were transmitted. In addition, the subcarriers 122 may be affected in the amplitude, frequency, or phase domain due to the effects of the transmission channel 120. For example, the subcarriers 118 may be affected by the optical link or the RF communication path, based on the type of the transmission channel 120.

In some implementations, the receiver 103 can include one or more path engines (e.g., similar to the number of path engines found in the transmitter 101), a gain-sharing module 132 spread across each of the path engines in the receiver 103, a digital de-multiplexer 128, and a RX system 124. In some implementations, the RX system 124 can include a dual polarized RX PIC modulator for optical communication systems. Alternatively, the RX system 124 may include something other than a PIC. For example, RX system 124 can include a demodulator for receiving data using a local oscillator and a mixer to recover the signal from the carrier signal, such as in an RF communication system.

The receiver 103 can include one or more path engines that properly output data from the synthesized high data rate subcarriers 118. In particular, each path engine can include an ADC, a receiver digital signal processor (DSP), a de-interleaver, and an FEC decoder. Additionally, a gain-sharing module 132 can be shared across each path engine of the receiver 103 to gain-sharing functions for the receiver 103. For example, as illustrated in system 100, a path engine in the receiver 103 can include an ADC 126-1, an RX DSP 128-1, a de-interleaver 130-1, and an FEC decoder 134-1. In another example, a second path engine for the receiver 103 can include an ADC 126-N, a receiver DSP 128-2, a de-interleaver 130-N, and an FEC decoder 134-2. The receiver 103 can include N number of path engines. In some implementations, the receiver 103 can include the same number of path engines as the transmitter 101. Additionally, a portion of the gain-sharing module 132 is shared across each of the path engines in the receiver 103. In particular, the gain-sharing module 132 is shared between the FEC decoder 134-1 and the de-interleaver 130 for each path engine. Additionally, each path engine can include an amplifier in the RX system 124 to increase the gain of the receive signal to help offset any effects impaired by the transmission channel 120.

The receiver 103 can additionally include a digital de-multiplexer 128. The digital de-multiplexer 128 receives data from the ADCs 126-1 through 126-N and outputs data to each of the path engines. For example, the digital de-multiplexer 128 can take N number of input lines and outputs $2^N$ lines to the path engines. In order for this system to work, the number of path engines needs to be equivalent to $2^N$. The ADC converters 16-1 through 126-N provides digital values to the digital de-multiplexer 128. In response, the digital de-multiplexer 128 outputs data to each of the path engines in the receiver 13.

In some implementations, the RX system 124 can include a local oscillator, a mixer, and a detector. The RX system 124 can be a PIC, for example, where each of the local oscillator, the mixer, and the detector are integrated on a single circuit. Alternatively, the RX system 124 can be integrated on one or more circuits, such as one or more PICS.

In some implementations, the RX system 124's local oscillator can include a laser, a collection of lasers, or some other device. The local oscillator can provide an optical signal to the mixer within the RX system 124. In some implementations, the local oscillator may include a single-sided laser to provide an optical signal to the mixer. Alternatively, the local oscillator may include a double-sided laser to provide multiple optical signals to multiple mixers.

The mixer within the RX system 124 can include a combiner that receives the optical input signal from the multiple subcarriers 118 and the optical signal from the local oscillator and combines the optical signals to generate an output optical signal. The mixer, in some implementations, may split the optical input signal into two, create two orthogonal signals. For example, the mixer may perform this by adding the first optical input signal and the optical signal from the local oscillator with zero phase, and by adding the second optical input signal the optical signal from the local oscillator with 90 degrees phase. In response, the mixer would combine the two orthogonal signals for presentation to the detector.

In some implementations, the detector can include a photodetector, such as a photodiode, to receive the output optical signal, from the mixer, and convert the output optical signal to corresponding voltage signals. In other implementations, the detector can detect the entire spectrum (e.g., containing all of the subcarriers from the multiple subcarriers 118).

In some implementations, the RX system 124 may include a local oscillator to generate an intermediate frequency (IF) in an RF communications environment. The local oscillator provides the IF to a mixer to change the incoming radio signal frequency of the multiple subcarriers 118 to a higher, or lower, fixed, IF. The RX system 124 also includes an IF band-pass filter and an amplifier to retrieve the specific subcarrier, amplify the subcarrier, and narrow-band filter on the particular subcarrier of the received signal. The demodulator extracts the signal located at the IF and provides it to the ADCs 126.

The receiver 103 can include one or more ADCs 126-1 through 126-N. The ADCs 126-1 through 126-N shown on each path engine receives the output from the RX system 124. In particular, the ADC, such as ADC 126-1 receives the analog voltage values from the RX system 124 and based on the values of the voltage, generate digital signals to apply to the digital de-multiplexer 128. For example, the higher the voltage, the higher the higher the integer value. If the ADC 126-1 receives a voltage value of +4.7 volts, the ADC 126-1 can generate an integer value of one. Alternatively, other integers and corresponding voltage values can be used.

In some implementations, the receiver 103 may include one ADC 126 that receives the output of the RX system 124. In other implementations, the receiver 103 may include a number of ADCs 126 desired by the designer of the system 100. For example, if the number of ADCs 126 is two, the first ADC 126-1 can be used to perform an analog-to-digital conversion on a particular set of values while the second ADC 126-2 can be used to perform an analog-to-digital conversion on another set of values.

In some implementations, the digital de-multiplexer 128 may include a device for de-multiplexing a stream of digital samples from the ADC 126-1 through 126-N. The de-multiplexer 128 can receive the digital samples from the ADC 126-1 through 126-N, de-multiplex the digital samples, and provide the de-multiplexed digital samples to the path engines of the receiver 103. The number of outputs of the de-multiplexer 128 can match the number of path engines in the receiver 103, for example.

Each of the path engines also includes a receiver (RX) digital signal processor (DSP) (collectively 128). The RX DSPs 128 can receive the de-multiplexed digital samples from the digital de-multiplexer 128 and produce demodulated data to provide to the de-interleavers 130. For example, the RX DSP 128-1 can receive the de-multiplexed digital samples from the digital de-multiplexer 128 at the first data rate, de-multiplex the samples according to the subcarrier scheme, and independently demodulate the samples for each of the subcarriers from the subcarriers 118, map the processed samples of the subcarriers to produce output data, and output the data. In particular, the RX DSPs 128 can detect the subcarriers provided by the digital de-multiplexer 128 and perform a function on each of those subcarrier components. For example, the RX DSP may perform functions such as an overlap and save method, an FFT, a de-multiplexer, filtering, equalizing components, IFFT component, carrier recovery, symbols to bits, output bits, and mux component. This will be further described below.

The output of the RX DSPs 128 across each of the path engines includes a de-interleaver (collectively 130). In some implementations, the de-interleaver 130 receives the bits from the RX DSPs 128 and performs systematically a de-interleaving operation on the interleaving bits performed by the transmitter 101. For example, the de-interleaver 130 de-interleaves the bits provided by the RX DSPs 128 based on the random interleaving function or the algebraic interleaving function performed by the interleaver 108 at the transmitter 101. In order for the de-interleavers 130 to perform this feature, the de-interleavers 130 must have knowledge of the interleaving function performed at the transmitter 101.

Similar to the gain-sharing module 106, the gain-sharing module 132 is spread across each of the path engines in the receiver 103. In other implementations, the gain-sharing module 132 is used only on one path engine or a desired number of path engines, where the desired number of path engines is less than the total number of path engines. The gain-sharing module 132 seeks to undue the splitting performed by the gain-sharing module 106. In order for the gain-sharing module 132 to undue the operation performed by the gain-sharing module 106, the gain-sharing module 132 must have knowledge of the operation performed by the gain-sharing module 106. Thus, the gain-sharing module 132 can do the reverse of the operation. For example, if the gain-sharing module 106 split a block between two path engines in the transmitter 101, the gain-sharing module 132 can provide the split data on the receiver 103 side to the correct path engine. The gain-sharing module 132 may read a bit flag that is stored within the de-interleaved data (e.g., input by the gain-sharing module 106) that denotes how to recover the operation performed by the gain-sharing module 106. Alternatively, the designers of the system may design the gain-sharing module 132 in such a manner that it automatically knows which FEC decoder 134 the de-interleaved data should be provided to for decoding.

Each FEC decoder (collectively 134) on a particular path engine can perform one or more decoding algorithms on the de-interleaved data provided by the gain-sharing module 132. For example, the decoding algorithms can include a Viterbi decoding algorithm, a reed-solomon decoding algorithm, or a turbo decoding algorithm. The operation performed by the FEC decoders 134 must be performed to undo the encoding operation performed by the FEC encoders 104. The output data (collectively 136) of the FEC decoders 134 can be bits or bytes properly transmitted, received, and decoded by the transmitter 101 and receiver 103.

Figure 2A:
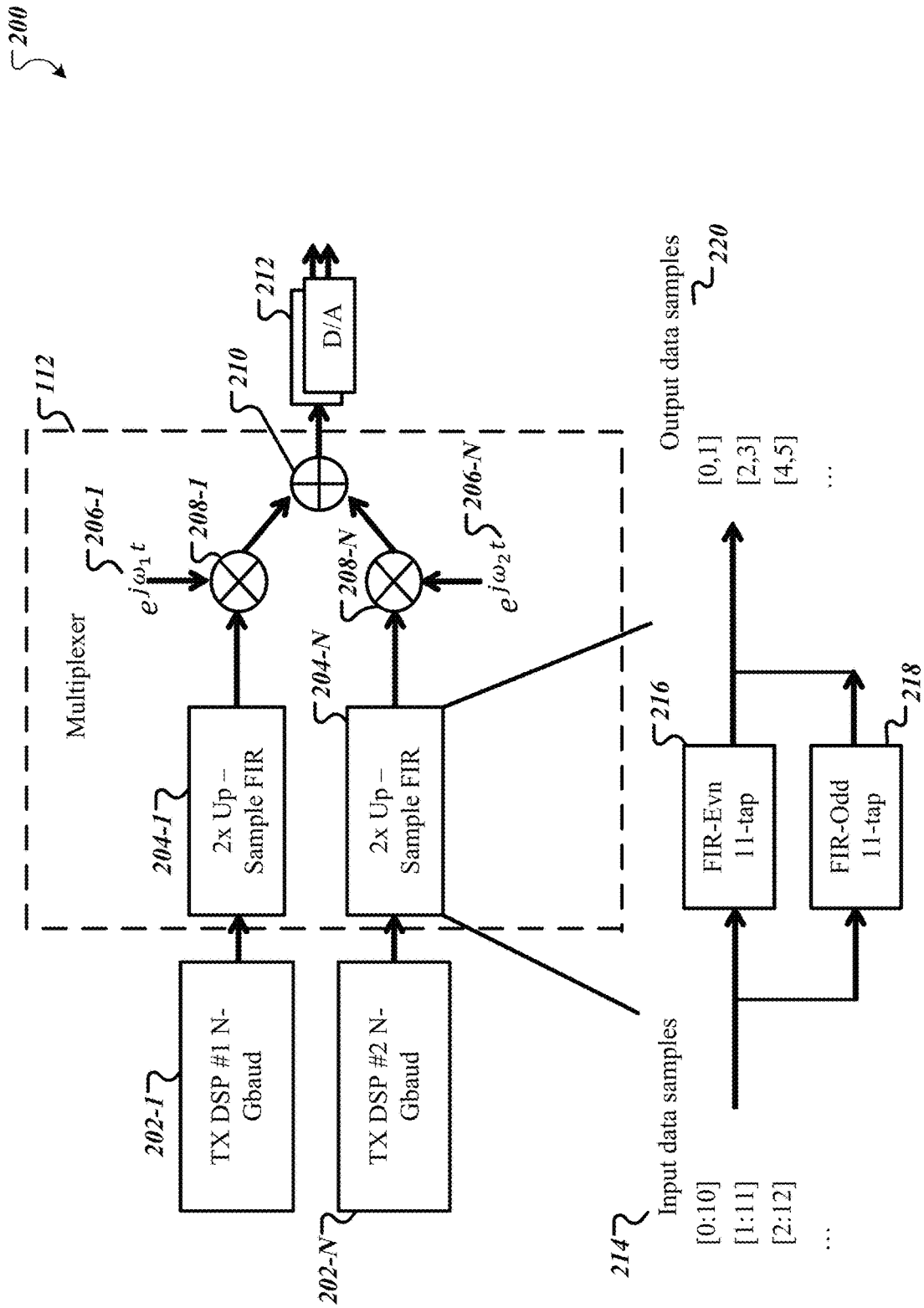
FIG. 2A is a block diagram that illustrates an example of a system for producing a high data rate signal.

FIG. 2A is a block diagram that illustrates an example of a system 200 for producing a high data rate signal. The system 200 includes components similar to system 100. The system 200 illustrates two path engines. For example, one path engine shown in system 200 includes a TX DSP 202-1, an up sampler 204-1, and a multiplier 208-1. The other path engine shown in system 200 includes TX DSP 202-N, an up sampler 204-N, and a multiplier 208-N. In other examples, the number of path engines may be greater than two or less than two.

In some implementations, system 200 illustrates a more detailed depiction of the digital multiplexer 112 from system 100. For example, the digital multiplexer 112 includes an up sampler 204-1, an up sampler 204-N, a multiplier 208-1, a multiplier 208-N, an adder 210, a first set of complex coefficients 206-1, and a second set of complex coefficients 206-N. The number of path engines in system 200 (e.g., in the transmitter 101) dictates the number of elements found in the digital multiplexer 112. For example, since the number of path engines shown in system 200 is two, there are two up samplers, namely up sampler 204-1 and up sampler 204-N; there are two multipliers, namely multiplier 208-1 and multiplier 208-N; and, there are two sets of complex coefficients 206, namely complex coefficients 206-1 and complex coefficients 206-N. Additionally, the number of path engines dictates the up sampling factor performed by the up samplers 204-1 and 204-N. For example, since two path engines exist in system 200, the up sampling factor performed by the up samplers 204-1 and 204-N is two. Alternatively, if the number of path engines shown in system 200 was three, system 200 would illustrate three up samplers (e.g., up sampler 204-1, up sampler 204-2, and up sampler 204-N); three multipliers (e.g., multiplier 208-1, multiplier 208-2, and multiplier 208-N); three sets of complex coefficients 206 (e.g., complex coefficients 206-1, complex coefficients 206-2, and complex coefficients 206-N); and the up sampling factor performed by each of the up samplers 204-1, 204-2, and 204-N would be three. Similarly, the numbers would change for four, five, six, etc., path engines.

In one example, the TX DSP 202-1 may output a set of samples to the digital multiplexer 112 on path engine one. The digital multiplexer 112 can provide the set of samples to the up sampler 204-1, which produces output data samples based on the characteristics of the up sampler 204-1. Similarly, the TX DSP 202-2 may output a set of samples to the up sampler 204-2 in the digital multiplexer 112, and the up sampler 204-2 produces a set of output data samples. For example, the TX DSPs 202 can provide subcarriers that are up sampled by a factor of 2, 3, 4, etc., based on the number of path engines. The up-sampler 204 can provide the up sampled subcarrier data to the multipliers to shift the subcarriers in the frequency domain by a factor of ω. For example, the up sampled subcarriers from the up sampler 204-1 can be shifted by a magnitude of $\omega_1$ and the up sampled subcarriers from the up sampler 204-2 can be shifted by a magnitude of $\omega_2$. In one example, $\omega_1$ can equate to a value of 30 GHz and $\omega_2$ can equate to a value of –30 GHz. In the case of three path engines, the system 200 can include three up samplers (204-1, 204-2, and 204-3) and the output of each up sampler would be multiplied by a different magnitude of ω. For example, the output of up sampler 204-1 would be multiplied by complex coefficients with a magnitude of $\omega_1$ (e.g., which could equate to –30 GHz); the output of up sampler 204-2 would multiplied by complex coefficients with a magnitude of $\omega_2$ (e.g., which could equate to 0 Hz); and, the output of up sampler 204-3 would multiplied by complex coefficients with a magnitude of $\omega_3$ (e.g., which could equate to 30 GHz).

Additionally, system 200 illustrates the internals of an up-sampler, such as up-sampler 204-N. The up-sampler 204-N includes an FIR N-tap filter 216 and an FIR N-tap filter 218. The number of FIR N-tap filters within a particular up sampler is dependent upon the number of path engines with the system 200. For example, if the number of path engines is three, then the up-sampler 204 would include three FIR N-tap filters. In that case, the FIR-zero 11-tap filter 216 would have zero delay, the FIR-one 11 tap filter 218 would have a single delay, and the FIR-two 11 tap filter would have a double delay.

The number of taps in the FIR filter is designed based on system and/or user requirements. As shown in system 200, the number of taps is 11. Thus, an FIR filter can receive 11 subcarriers 214 and output a single sample 220. For example, FIR-Even 11-tap filter 216 can receive samples [0:10] and output a sample "0." The FIR-Odd 11-tap filter 218 can then receive samples "[1:11]" and output a sample "1." Then, the up sampler FIR 204-N outputs a sample 220 of "[0,1]" to the multiplier 208-N. Next, the FIR-Even 11-tap filter 216 receives samples "[2:12]" and outputs a sample "2." The FIR-Odd 11-tap filter 18 can then receive samples "[3:13]" and outputs a sample "3." Then, the up sampler FIR 204-N outputs a sample 220 of "[2,3]" to the multiplier 208-N. This process repeats until all subcarriers 214 provided by the TX DSPs 202 have been processed.

In some implementations, the adder 210 can combine the output of each of the multipliers 208-1 through 208-N. Thus, a spectral view of the summer 210's output would include the subcarriers spaced by different values of ω. The summer 210 can provide the output the one or more DACs 212.

Figure 2B:
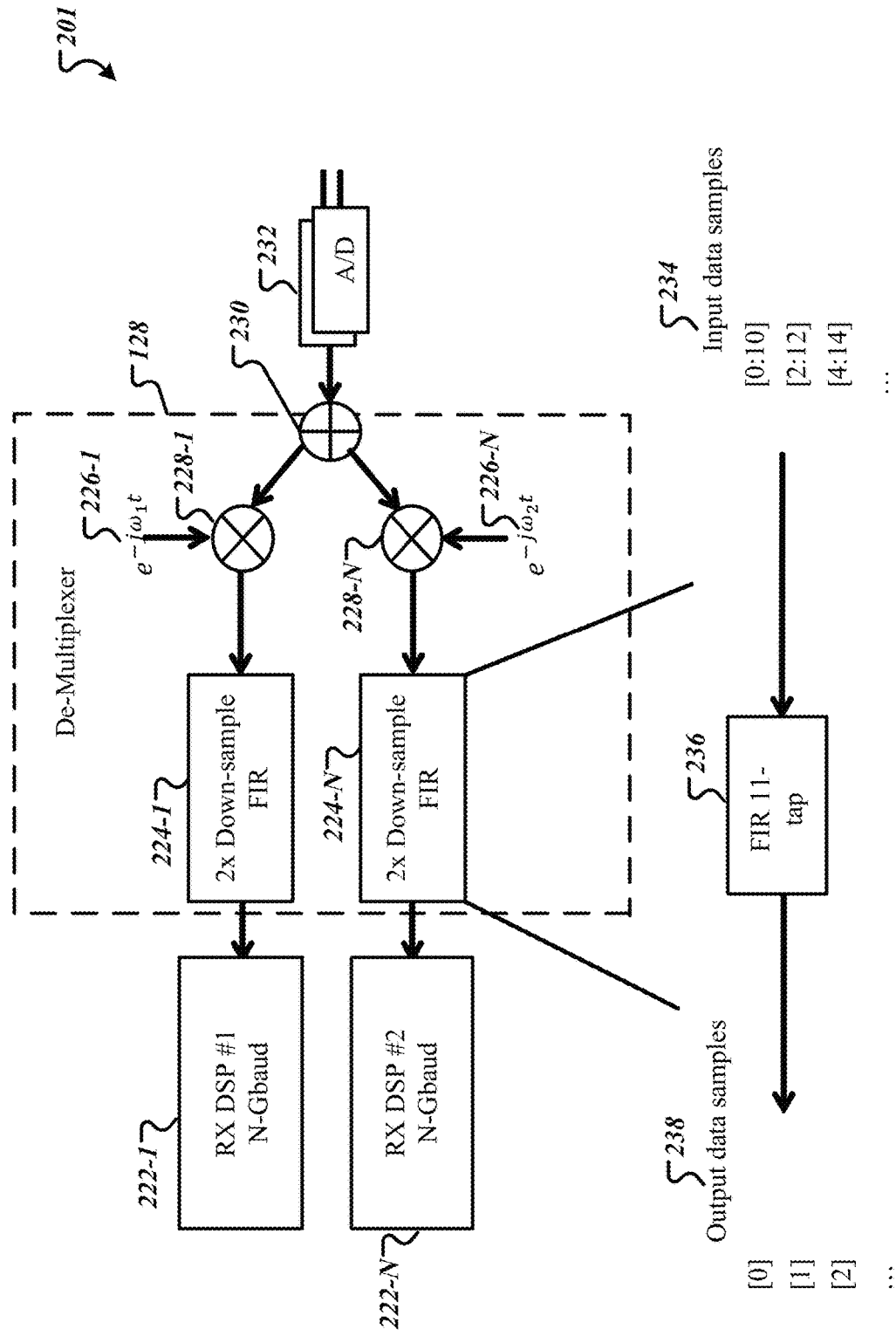
FIG. 2B is a block diagram that illustrates an example of a system for processing a high data rate signal.

FIG. 2B is a block diagram that illustrates an example of a system 201 for processing a high data rate signal. The system 201 includes components similar to system 100 and 200, and performs functions similar to functions performed in system 200. The system 201 illustrates two path engines. For example, one path engine shown in system 200 includes a multiplier 228-1, a down sampler 224-1, and a RX DSP 222-1. The other path engine shown in system 201 includes a multiplier 228-N, a down sampler 224-N, and a RX DSP 222-N. In other examples, the number of path engines may be greater than two or less than two.

In some implementations, system 201 illustrates a more detailed depiction of the digital de-multiplexer 128 from the system 100. For example, the digital de-multiplexer 128 includes a down sampler 224-1, a down sampler 224-N, a multiplier 228-1, a multiplier 228-N, a splitter 230, a first set of complex coefficients 226-1, and a second set of complex coefficients 226-N. The number of path engines in system 201 (e.g., in the receiver 103) dictates the number of elements found in the de-multiplexer 128. For example, since the number of path engines shown in system 201 is two, there are two down samplers, namely down sampler 224-1 and down sampler 224-N; there are two multipliers, namely multiplier 228-1 and multiplier 228-N; and, there are two sets of complex coefficients 226, namely complex coefficients 226-1 and complex coefficients 226-N. Additionally, the number of path engines dictates the down sampling factor performed by the down-samplers 224-1 and 224-N. For example, since two path engines exist in system 221, the down sampling factor performed by the down-samplers 224-1 and 224-N is two. Alternatively, if the number of path engines shown in system 201 was three, system 201 would illustrate three down samplers (e.g., down sampler 224-1, down sampler 224-2, and down sampler 204-N); three multipliers (e.g., multiplier 228-1, multiplier 228-2, and multiplier 228-N); three sets of complex coefficients 226 (e.g., complex coefficients 226-1, complex coefficients 226-2, and complex coefficients 226-N); and the down sampling factor performed by each of the down-samplers 224-1, 224-2, and 224-N would be three. Similarly, the numbers would change for four, five, six, etc., path engines. The de-multiplexer 128 includes down samplers (unlike the digital multiplexer 112, which includes up samplers) because the de-multiplexer undoes the operations performed by the digital multiplexer 112. For example, since the digital multiplexer 112 up sampled by a factor of two, the de-multiplexer 128 down samples by a factor of two.

In one example, the ADCs 232 output digital subcarrier samples to be processed by the de-multiplexer 128. The de-multiplexer 128 can provide the set of digital subcarrier samples to the splitter 230. The splitter 230 can split the digital subcarrier samples by sending a copy the set of digital subcarrier samples to each path engine. For example, the splitter 230 provides samples to the multiplier 228-1 and samples to the multiplier 228-N. The splitter 230 can provide the digital subcarrier samples to the multipliers to shift the subcarriers in the frequency domain by a factor of w, but opposite in magnitude to the shifted magnitude in the up sampler at the digital multiplexer 112. Thus, the complex coefficients 226-1 and complex coefficients 226-N have a magnitude of $-\omega_1$ and $-\omega_2$, respectively. The de-multiplexer 128 has to undo the operation performed by the digital multiplexer 112, thus, multiplying the digital subcarrier samples by a negative complex coefficient shifts the subcarriers to a location in frequency before they were shifted in frequency by $\omega_1$ and $\omega_2$ at the multiplexer 112. For example, $-\omega_1$ can equate to a value of –30 GHz and $-\omega_2$ can equate to a value of 30 GHz. In the case of three path engines, the system 201 can include three multipliers (228-1, 228-2, and 228-N) each multiplied by a different magnitude of ω. For example, the output of splitter 230 would be multiplied by complex coefficients with a magnitude of $-\omega_1$ (e.g., which could equate to 30 GHz) on path engine one; the output of splitter 230 would be multiplied by complex coefficients with a magnitude of $-\omega_2$ (e.g., which could equate to 0 Hz); and, the output of splitter 230 would be multiplied by complex coefficients with a magnitude of $-\omega_3$ (e.g., which could equate to –30 GHz).

The output of the multipliers 228 on the path engine is provided to a down-sampler FIR 224. The de-multiplexer 128 includes a down sampler 224 to undo the operation performed by the digital multiplexer 112, which was to up sample. Additionally, the magnitude of down sampling equates to the magnitude of up sampling performed at the digital multiplexer 112. For example, the digital multiplexer 112 up sampled by a value of two, thus, the de-multiplexer 128 down samples by a value of two.

Additionally, system 201 illustrates the internals of the down-sampler, such as down-sampler 224-N. The down-sampler 224-N includes an FIR N-tap filter 236 that down samples by a factor of two (e.g, the number of path engines and the factor that was up sampled.) The number of taps shown in the FIR N-tap filter 236 is 11, the same number of taps provided in the FIR filter designed in the up-sampler in the digital multiplexer 112. Other values for N can be used.

The FIR 11-tap filter 236 can grab a set of 11 samples 234 and output a single sample 238. For example, the FIR 11-tap filter 236 can receive samples [0:10] and output a sample "[0]." Because the down-sample FIR filter is performing down sampling by a factor of two, the next set of samples are skipped. Thus, samples "[1:11]" are skipped and the next samples "[2:12]" are retrieved and processed through the FIR 11-tap filter 236. The FIR 11-tap filter 236 outputs a sample "[1]." This process repeats until all digital subcarrier samples provided by the ADCs 232 have been processed. In the case of down factoring by a sample of three, the FIR 11-tap filter 236 would first grab samples "[0:10]" and then grab samples "[3:13]", skipping two sets of samples. These output samples 238 are provided to the respective RX DSP 222 along a corresponding path engine.

Figure 3:
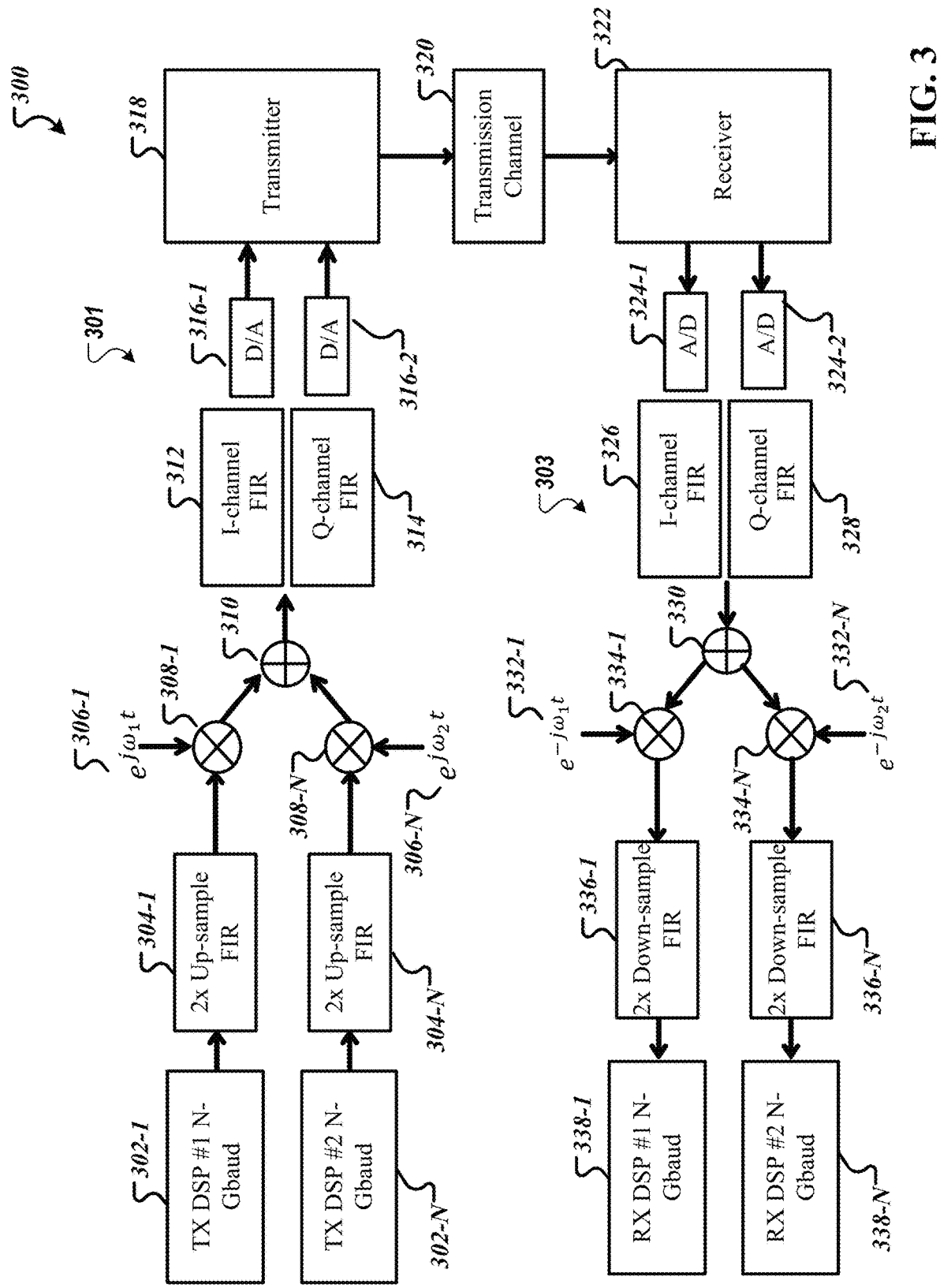
FIG. 3 is another block diagram that illustrates an example of a system for synthesizing low data rate signals to produce a high data rate signal.

FIG. 3 is a block diagram that illustrates an example of a system 300 for synthesizing low data rate signals to produce a high data rate signal. System 300 includes similar components to systems 100, 200, and 201. For example, system 300 includes TX DSPs 302, up-samplers 304, complex coefficients 306, multipliers 308, a summer 310, DACs 316, transmitter 318, transmission channel 320, receiver 322, ADCs 324, splitter 330, multipliers 334, down-samplers 336, and RX DSPs 338. Thus, only the components that differ in system 300 will be discussed below.

In particular, the transmitter 301 includes an I-channel FIR 312 and a Q-channel FIR 314 at the output of the adder 310. The data provided by the adder 310 to the I-channel FIR 312 and the Q-channel FIR 314 is complex data (e.g., includes real and imaginary components.) The I and Q channel FIR 312 and 314 compensate for crosstalk that could potentially harm the complex signals provided by the adder 310. Crosstalk occurs when a signal transmitted by the adder 310 creates an undesired effect (e.g., amplitude, phase, or frequency effect) on another component of the signal. For example, the in-phase component of the signal provided by the adder 310 could potentially affect the quadrature component of the signal provided by the adder 310. This can cause an issue such that the message data is lost before the transmitter 301 even transmits the data across the transmission channel 320.

In order to pre-empt this type of cross talk, the I-channel FIR 312 compensates the real components of the complex signal provided by the adder 310 and the Q-channel FIR 314 compensates the imaginary components of the complex signal provided by the adder 310. For example, if the complex data provided by the adder 310 includes eight subcarriers, the I-channel and Q-channel FIR 312 and 314 can ensure that the eight subcarriers remain orthogonal to one another across all channel frequencies, based on their real and imaginary parts. If the I-channel FIR 312 and Q-channel 314 do not properly compensate for orthogonality between the subcarriers (e.g., ensure that the in-phase components and quadrature components of each subcarrier remain orthogonal to one another), then the in-phase and quadrature components may skew or delay its amplitude, phase, and/or frequency causing it to bleed over to other subcarriers, and subsequently, causing issues at the receiver 322 to properly pull out the bit data from the received signal.

The output of the I-channel FIR 312 ensures the real components are not skewed or bleeding into the imaginary components. Similarly, the output of the Q-channel FIR 314 ensures the imaginary components are not skewed or bleeding into the real components. At the receiver 303, the receiver 303 includes an I-channel FIR 326 and a Q-channel FIR 328 to perform similar functions to I-channel FIR 312 and Q-channel FIR 314.

Figure 4A:
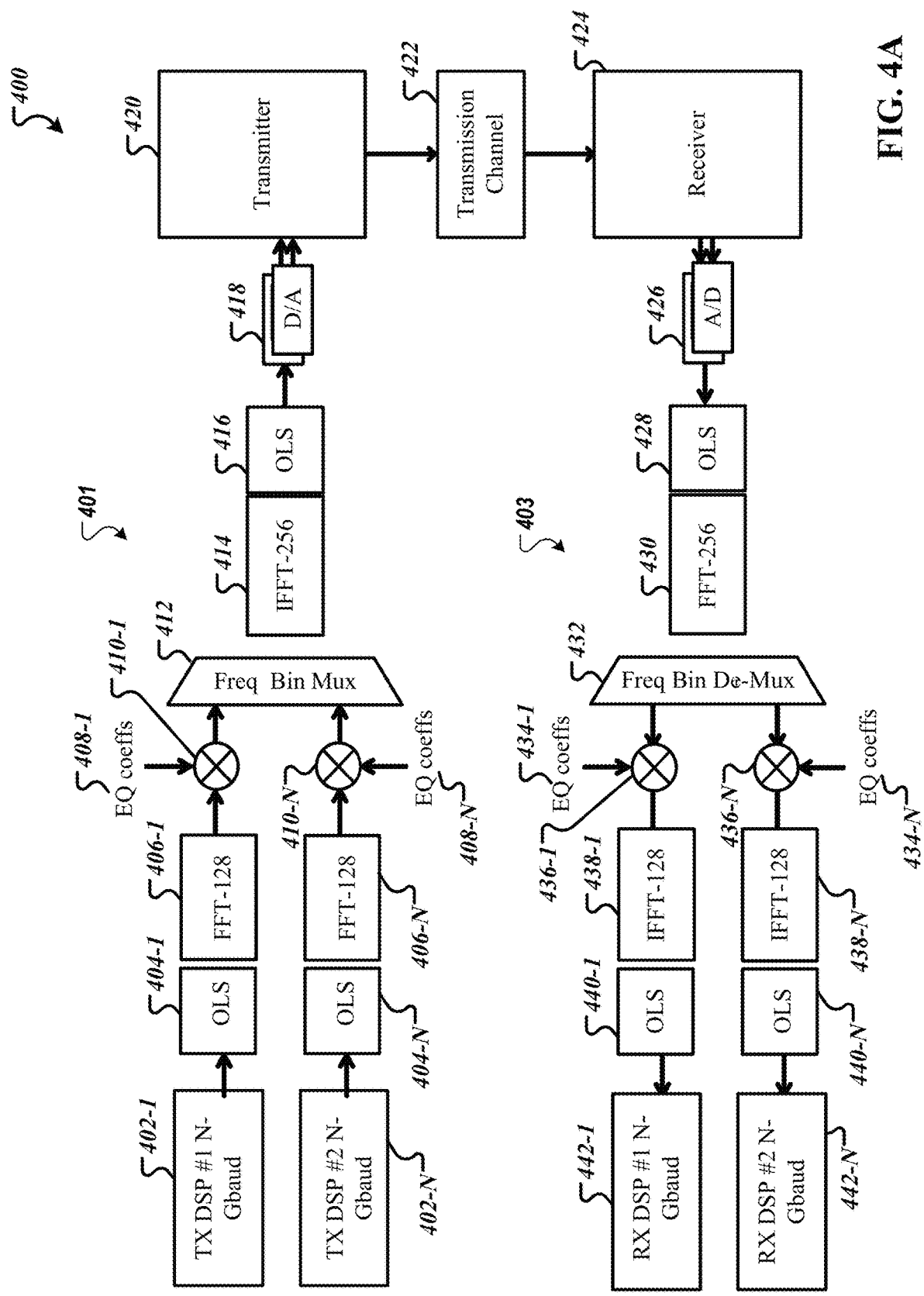
FIG. 4A is another block diagram that illustrates an example of a system for synthesizing low data signals to produce a high data rate signal.

FIG. 4A is a block diagram that illustrates an example of a system 400 for synthesizing low data signals to produce a high data rate signal. System 400 includes similar components to systems 100, 200, 201, and 300. For example, system 400 includes TX DSPs 402, DACs 418, transmitter 420, transmission channel 422, receiver 424, ADCs 426, and RX DSPs 442. Thus, only the components that differ in system 400 will be discussed below.

The system 400 includes one or more additional components at the transmitter 401 and at the receiver 403. In particular, the transmitter 401 includes an overlap save buffer, an FFT module, a frequency bin multiplexer 412, an IFFT module, and multipliers for equalizer coefficients. For example, path engine one at the transmitter 401 includes an overlap save buffer 404-1, an FFT component 406-1, and a multiplier 410-1 for equalizer coefficients 408-1. Path engine two at the transmitter 401 includes an overlap save buffer 404-1, an FFT module 406-N, a multiplier 410-N for equalizer coefficients 408-N. Additionally, transmitter 401 includes an IFFT component 414 and another overlap save buffer 416.

The receiver 403 includes similar components to the transmitter 401. In particular, the receiver 403 includes an overlap save buffer, an FFT module, a frequency bin de-multiplexer 432, an IFFT module, and multipliers for equalizer coefficients. For example, path engine one at the receiver 403 includes an overlap save buffer 440-1, an IFFT module 438-1, and a multiplier 436-1 for equalizer coefficients 434-1. Path engine two at the receiver 403 includes an overlap save buffer 440-N, an IFFT module 438-N, and a multiplier 436-N for equalizer coefficients 408-N. Additionally, receiver 403 includes an FFT module 430 and another overlap save buffer 428.

In some implementations, at the transmitter 401, the overlap and save buffer (collectively 406) receives symbols from the TX DSP (collectively 402). For example, the overlap and save buffer 404-1 on path engine one can buffer a predetermined amount of symbols, such as 128 symbols. The overlap and save buffer 404-1 may receive 64 symbols at each clock cycle from the TX DSP 402-1. The TX DSP 402-1 may map 6 bits to a symbol in the dual-polarization 64 QAM constellation. Thus, the overlap and save buffer 404-1 may combine 64 new symbols from the TX DSP 402-1 with the previous 64 symbols received from the TX DSP 402-1 in a 2 clock cycles worth of buffer (e.g., the $1^{st}$ 64 symbols and the $2^{nd}$ 64 symbols). The same functionality can occur on each of path engines in the transmitter 401. Alternatively, this functionality with the overlap and save method can work with a different amount of symbols and a different size buffered in to the overlap and save buffer 404.

The FFT component 406-1 may receive 128 symbols from the overlap and save buffer 404-1 every clock cycle. In addition, the FFT component 406-1 converts the received 128 symbols to the frequency domain using, for example, a fast Fourier transform (FFT). FFT component 406-1 may form 128 frequency bins because of performing the FFT. In particular, in the next clock cycle, when the FFT component 406-1 receives the 128 symbols stored in the overlap and save buffer 404-1, the overlap and save buffer 404-1 will shift out the $1^{st}$ 64 symbols so that it contains the $2^{nd}$ 64 symbols and the $3^{rd}$ 64 symbols received from the TX DSP 402-1, and then the FFT component 406-1 will take the FFT of the previous 64 symbols (e.g., $2^{nd}$ 64 symbols) plus the next 64 symbols (e.g., 3rd 64 symbols) received from the overlap and save buffer 404-1. Thus, the overlap and save buffer 404-1 performs an overlap function. The 128 frequency bins are then passed to the multiplier where they are pulse shaped by equalizer coefficients.

The multiplier 410-1 multiples the 128 frequency bins by equalizer coefficients 408-1 to calculate the transitions between the symbols and the desired spectrum so that the subcarriers can be packed together on the channel. Additionally, the equalizer coefficients 408-1 can also be used to introduce phase, time, and frequency shifts to correct for offsets produced by the transmission channel 422. Additionally, the equalizer coefficients 408-1 can be used to assist with amplitude adjustments produced by the transmission channel 422. The frequency bin multiplexer 412 may receive the subcarriers from each path (e.g., 33 Gbaud for each subcarrier set from each path) and multiplex the subcarriers together to form a 256 element vector.

The IFFT component 414 may receive the 256 element vector and return the signal back to the time domain, which may now be at 66 GSamples/s. The IFFT component 414 may convert the signal to the time domain using, for example, an inverse fast Fourier transform (IFFT). Additionally, the overlap and save buffer 416 may take the first 128 samples in the time domain from the 256 element vector and output the first 128 samples to the DAC 418 at 66 GSamples/s.

At the receiver 403, the overlap and save buffer 428 may receive digital subcarrier samples from the ADC 426. The ADC 426 can operate to output samples 66 GSamples/s, based on the transmission rate. The overlap and save buffer 428, for example, can receive 128 samples and the current 128 samples with the previous 128 samples, received from the ADC 426, to form a vector of 256 elements. In particular, the FFT module 430 can receive the 256 vector elements from the overlap and save buffer 428 and convert the vector elements to the frequency domain using, for example, a fast Fourier transform (FFT). For example, the FFT module 430 may convert the 256 vector elements to 256 frequency bins as a result of performing the FFT.

The receiver 403 can provide the 256 frequency bins from the FFT module 430 to the frequency bin de-multiplexer 432. The frequency bin de-multiplexer 432 may de-multiplex the 256 frequency bins to 128 element vectors for each of the four 33 Gbaud subcarriers to each path engine on the receiver 403. The 128 element vectors may be multiplied by the equalizer coefficients (collectively 434) using the multipliers (collectively 436) on each path engine. The equalizer coefficients 434 can equalize for polarization mode dispersion (PMD) equalization to compensate for PMD and polarization rotations.

In some implementations, the output of the multipliers 436 is provided to an IFFT component (collectively 438) on each path engine. In particular, the IFFT component may convert the 128 element vector (after being processed by the multipliers) back to the time domain as 128 samples. The IFFT component 438 may convert the 128 element vector to the time domain using, for example, an inverse fast Fourier transform (IFFT). Additionally, the overlap and save method 440 will take the first 64 components of the 128 element vector from the IFFT component 438 and output 64 samples to the RX DSP 442.

Figure 4B:
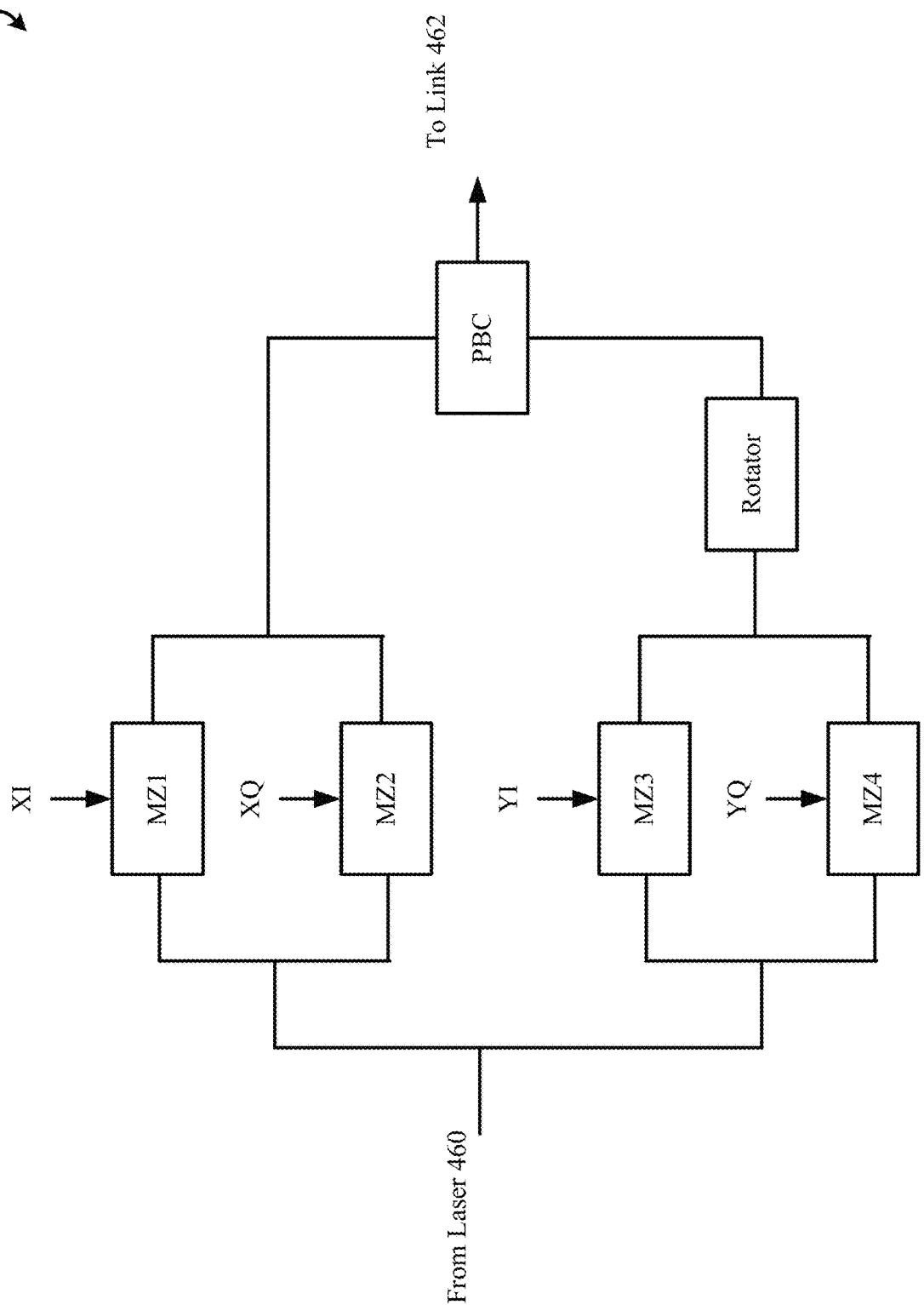
FIG. 4B is a block diagram that illustrates an example system of an optical modulator circuit.

FIG. 4B is a block diagram that illustrates an example system 450 of an optical modulator circuit. The example system 450 may be included in TX modulator 116 illustrated in system 100 and in transmitter 318 illustrated in system 300. As shown in system 450, each of analog drive signals XI, XQ, YI, and YQ is supplied to a corresponding one of modulators MZ1, MZ2, MZ3, and MZ4, each of which may include a Mach-Zehnder modulator. Light from laser 460 is split and a first portion of such light is supplied to modulators MZ1 and MZ2. The first portion of the light is further split such that part of the first portion of the light is supplied to modulator MZ1 to modulate the first part of the light to provide an in-phase component, for example, and another part of the first portion of the light is supplied to modulator MZ2, which modulates the other part of the first portion of the light to provide a quadrature component. The in-phase and quadrature components are then combined and supplied to a polarization beam combiner.

In addition, a second portion of the light output from laser 460 is supplied to modulators MZ3 and MZ4, which may also include Mach-Zehnder modulators. The second portion of the light is further split such that part of the second portion of the light is supplied to modulator MZ3 to modulate the first part of the light to provide an in-phase component, for example, and another part of the second portion of the light is supplied to modulator MZ4, which modulates the other part of the second portion of the light to provide a quadrature component. The in-phase and quadrature components are then combined, and the polarization thereof is rotated, for example, by 90 degrees, such that the combined in-phase and quadrature components have a transverse magnetic (TM) polarization, whereas the combined in-phase and quadrature components of the first portion of the light typically have a transverse electric polarization. The TM light is also supplied to the polarization beam combiner, which combines the TE modulated light and the TM modulated light into a polarization multiplexed signal and supplies such signal to optical communication path or link 462.

Figure 4C:
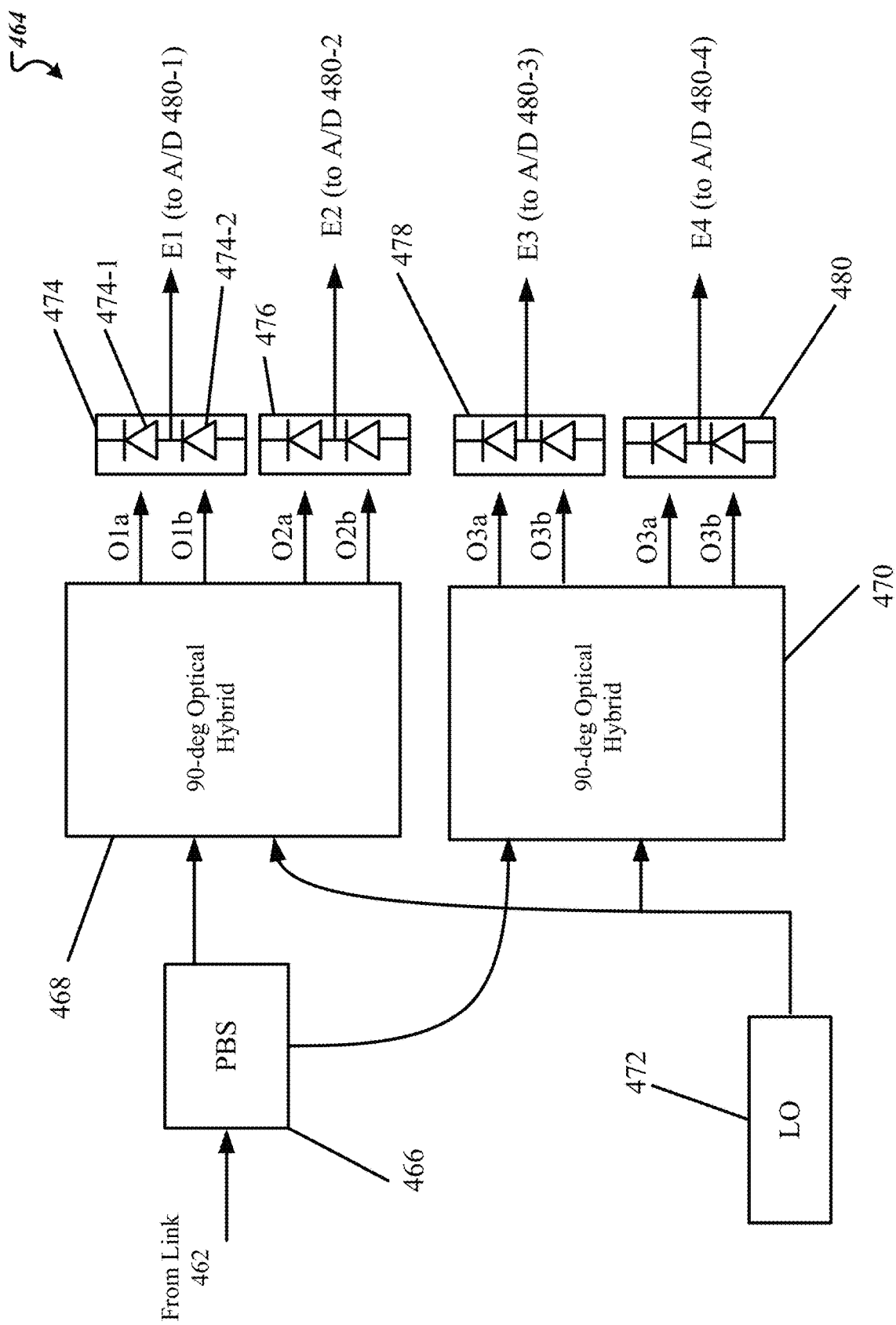
FIG. 4C is a block diagram that illustrates an example system of a coherent receiver.

The polarization multiplexed signal next propagates along optical communication path 462, which may include one or more segments of optical fiber and one or more optical amplifiers, to coherent receiver 464, which is shown in greater detail in FIG. 4C. The example coherent receiver 464 may be included in RX modulator 124 illustrated in system 100 and in the receiver 322 illustrated in system 300. As shown in FIG. 4C, coherent receiver 464 may include a polarization beam splitter (PBS) 466 operable to receive the polarization multiplexed optical signal and to separate the signal into X (TE) and Y (TM) orthogonal polarizations, i.e., vector components of the optical E-field of the incoming optical signals transmitted on optical communication path 462. The orthogonal polarizations are then mixed in 90-degree optical hybrid circuits ("hybrids") 468 and 470 with light from local oscillator (LO) laser 472 having a wavelength, for example, approximately equal to, the wavelength of the polarization multiplexed optical signal. Hybrid circuit 468 outputs, for example, four mixing products or optical signals O1a, O1b, O2a, O2b and hybrid circuit 470 outputs four optical signals or mixing products O3a, O3b, O4a, and O4b, each representing the in-phase (XI, YI) and quadrature (XQ, YQ) components of the optical E-field on the X (TE) and Y (TM) polarizations, and each including light from local oscillator 472 and light from polarization beam splitter 466. Optical signals O1a, O1b, O2a, O2b, O3a, O3b, O4a, and O4b are supplied to a respective one of photodetector circuits 474, 476, 478, and 480. Each photodetector circuit may include a pair of photodiodes (such as photodiodes 474-1 and 474-2) configured as a balanced detector, for example, and each such photodetector circuit supplies a corresponding one of electrical signals E1 (corresponding to XI), E2 (corresponding to XQ), E3 (corresponding to YI), and E4 (corresponding to YQ) to a respective one of ADC circuits 480-1 to 480-4. Alternatively, each photodetector may include one photodiode (such as photodiode 474-1) or single-ended photodiode. Electrical signals E1 to E4 are indicative of data carried by the polarization multiplexed optical signal input to PBS 466. For example, these electrical signals may comprise four base-band analog electrical signals linearly proportional to the in-phase (XI, YI) and quadrature (XQ, YQ) components of the optical E-field on X and Y polarizations.

Figure 5:
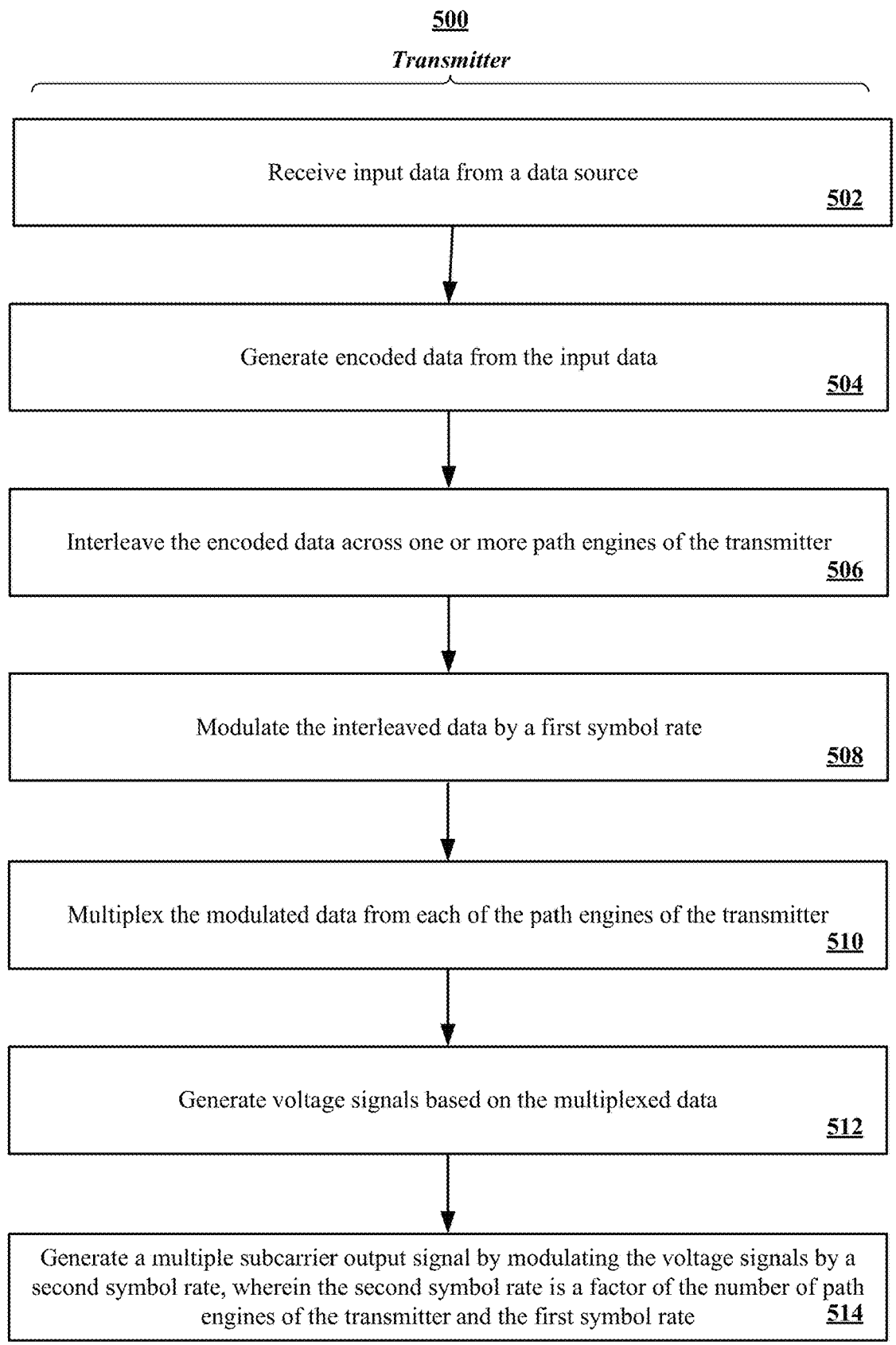
FIG. 5 is a flow diagram that illustrates an example of a process for transmitting a synthesized high data rate signal.

FIG. 5 is a flow diagram that illustrates an example of a process 500 for transmitting a synthesized high data rate signal. Generally, the process 500 includes receiving input data from a data source; generating encoded data from the input data; interleaving the encoded data across one or more path engines; modulating the interleaved data by a first symbol rate; multiplexing the modulated data from each of the path engines of the transmitter; generating voltage signals based on the multiplexed data; and, generating a multiple subcarrier output signal by modulating the voltage signals by a second symbol rate, wherein the second symbol rate is a factor of the number of path engines of the transmitter and the first symbol rate.

During 502, the transmitter receives input data from a data source. For example, the transmitter 101 can receive a bit stream or byte stream, which is to be transmitted over the transmission channel 120 to the RX system 124. For example, the input data 102-1 is a different set of data compared to the input data 102-N.

During 504, the transmitter generates encoded data from the input data. For example, the transmitter 101 provides the input data to an FEC encoder corresponding to a particular path engine. The FEC encoder encodes the input data using one or more encoding algorithms. For example, the encoding algorithms can include a Viterbi algorithm, a reed-solomon algorithm, a turbo coding scheme, or another convolutional encoding scheme.

During 506, the transmitter interleaves the encoded data across one or more path engines. The gain-sharing module at the transmitter receives the encoded data from the FEC encoder. In particular, the goal of the gain-sharing module 106 is to provide robustness against high bit error rate on any one particular engine. The gain-sharing module 106 receives the data from each of the FEC encoders 104 on the particular path engine, mixes the received data, and outputs the mixed data to different path engine. For example, the gain-sharing module 106 can mix the data to different path engines based on random assignments. Alternatively, the gain-sharing module 106 can mix the data to different path engines based on a designated assignment. By splitting the data stream to a different path engine, the system 100 can provide robustness against bit error rates. In particular, by splitting the data stream, each path engine can see the same bit error rate on a corresponding path engine of the receiver 103.

The output of the gain-sharing module 106 is provided to an interleaver, such as interleaver 108-1, on each path engine. In some implementations, the interleavers (collectively 108) receive the gain-shared data and perform an interleave operation on the gain-shared data. For example, the interleavers 108 may perform a random interleaving function where a data block is moved at random based on a permutation and/or a random seed value. In another example, the interleavers 108 may perform an algebraic interleaving function where a data block is moved based on a permutation that has been algebraically derived.

During 508, the transmitter modulates the interleaved data by a first symbol rate. In particular, the transmitter includes a TX DSP across each path engine that maps the streams of interleaved data onto each of the subcarriers, applies spectra shaping to each of the subcarriers to be resistant to channel effects from the transmission channel 120, and obtains, based on the spectral shaping of each of the subcarriers, a sequence of values to apply to the digital multiplexer 112. Additionally, the TX DSP may produce digital subcarriers at a desired symbol rate. For example, the components within the TX DSP 110 may produce digital subcarrier samples at a rate of 33 Gbaud.

During 510, the transmitter multiplexes the modulated data from each of the path engines of the transmitter. In particular, the transmitter includes a multiplexer that receives the integer values from each of the path engines (e.g., in particular, the TX DSP 110s) and output signals to the DAC 114. For example, the digital multiplexer 112 may receive real (e.g., X-polarity) values and imaginary (e.g., Y-polarity) values from each of the path engines and output a single output containing both the real and imaginary values. Alternatively, the digital multiplexer 112 may include multiple outputs (e.g., less than the number of outputs from the path engines), such as two During 512, the transmitter generates voltage signals based on the multiplexed data. The transmitter uses DACs to generate voltage signals using the multiplexed data. In particular, the DAC, such a DAC 114-1 can receive the sequence of integers from the digital multiplexer 112 and based on the sequence of assigned integers, generate voltage signals to apply to the TX modulator 116. For example, the higher the integer, the higher the voltage signal. If the DAC 114-1 receives an integer of one, the DAC 114-1 can generate a voltage of +5 volts.

During 514, the transmitter generates a multiple subcarrier output signal by modulating the voltage signals by a second symbol rate, wherein the second symbol rate is a factor of the number of path engines of the transmitter and the first symbol rate. In particular, the TX modulator 116 generates multiple subcarriers 118 at a second data rate (e.g., or second symbol rate). The second data rate is a multiplicative factor of the first symbol rate corresponding to each of the TX DSPs 110 and the number of path engines. For example, if TX DSP 110-1 through 110-N has a symbol rate of 33 Gbaud and the transmitter 101 has two path engines, then the second data rate output by the TX modulator 116 is multiplicative factor of 33 Gbaud and two path engines, resulting in 66 Gbaud.

Figure 6:
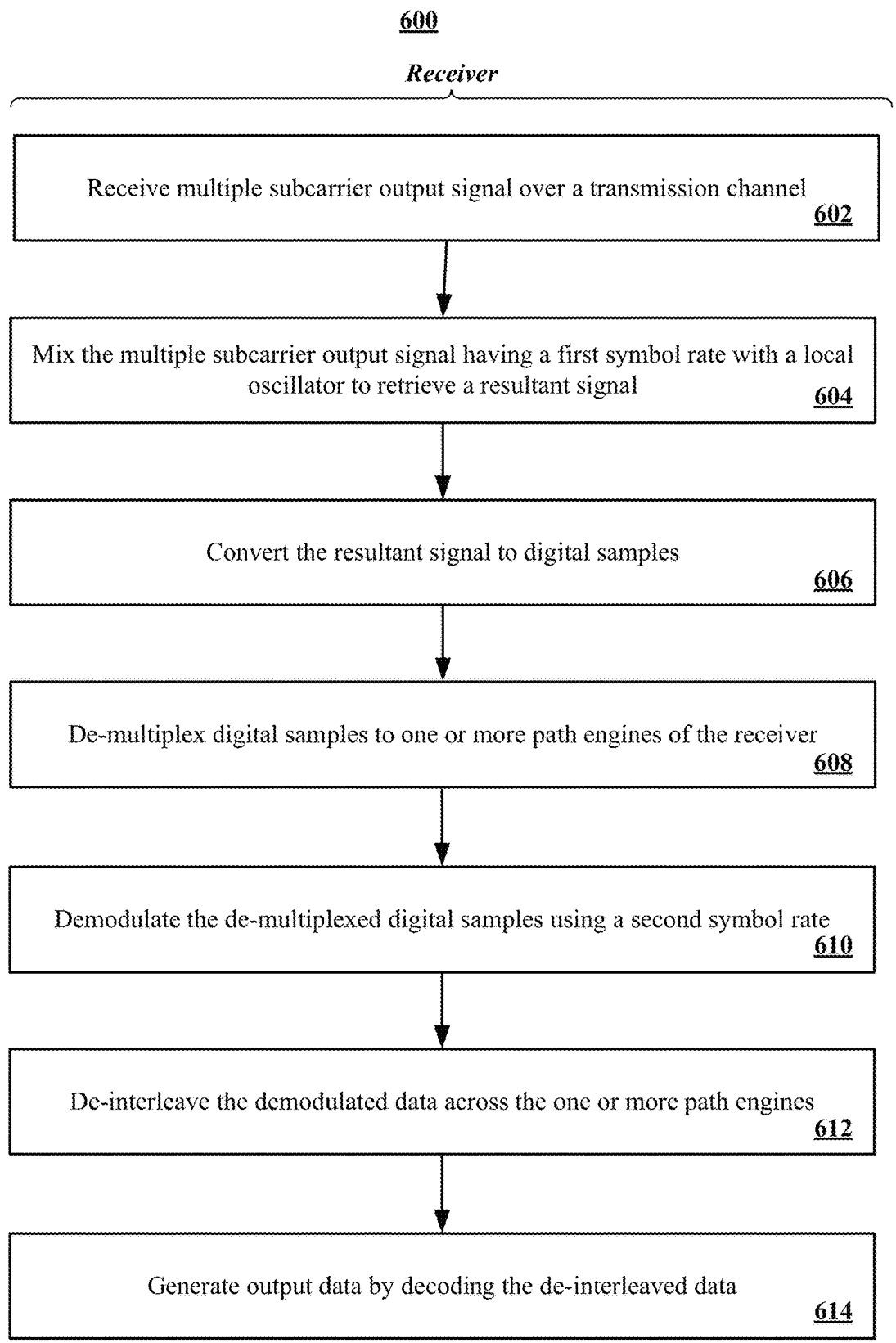
FIG. 6 is a flow diagram that illustrates an example of a process for receiving and processing a high data rate signal.

FIG. 6 is a flow diagram that illustrates an example of a process 600 for receiving and processing a high data rate signal. Generally, the process 600 includes receiving multiple subcarrier output signal over a transmission channel; mixing the multiple subcarrier output signal having a first symbol rate with a local oscillator to retrieve a resultant signal; converting the resultant signal to digital samples; de-multiplexing digital samples to one or more path engines of the receiver; demodulating the de-multiplexed digital samples using a second symbol rate; de-interleaving the demodulated data across the one or more path engines; and generating output data by decoding the de-interleaved data.

During 602, the receiver receives multiple subcarrier output signal over a transmission channel. In particular, the receiver 103 can receive the subcarriers 122 over the transmission channel 120. The subcarriers 122 can be received at a particular frequency that the subcarriers 118 were transmitted. In addition, the subcarriers 122 may be affected in the amplitude, frequency, or phase domain due to the effects of the transmission channel 120.

During 604, the receiver mixes the multiple subcarrier output signal having a first symbol rate with a local oscillator to retrieve a resultant signal. In particular, the local oscillator can provide an optical signal to the mixer within the RX system 124. In some implementations, the local oscillator may include a single-sided laser to provide an optical signal to the mixer. Alternatively, the local oscillator may include a double-sided laser to provide multiple optical signals to multiple mixers.

In some implementations, the RX system 124 may include a local oscillator to generate an intermediate frequency (IF) in an RF communications environment. The local oscillator provides the IF to a mixer to change the incoming radio signal frequency of the multiple subcarriers 118 to a higher, or lower, fixed, IF. The RX system 124 also includes an IF band-pass filter and an amplifier to retrieve the specific subcarrier, amplify the subcarrier, and narrow-band filter on the particular subcarrier of the received signal. The demodulator extracts the signal located at the IF and provides it to the ADCs 126.

During 606, the receiver converts the resultant signal to digital samples. In particular, the ADCs (126-1 through 126-N) shown on each path engine receives the output from the RX system 124. In particular, the ADC, such as ADC 126-1 receives the analog voltage values from the RX system 124 and based on the values of the voltage, generate digital signals to apply to the digital de-multiplexer 128. For example, the higher the voltage, the higher the higher the integer value.

During 608, the receiver de-multiplexes digital samples to one or more path engines of the receiver. For example, the de-multiplexer 128 can receive the digital samples from the ADC 126-1 through 126-N, de-multiplex the digital samples, and provide the de-multiplexed digital samples to the path engines of the receiver 103. The number of outputs of the de-multiplexer 128 can match the number of path engines in the receiver 103, for example.

During 610, the receiver demodulates the de-multiplexed digital samples using a second symbol rate. The RX DSPs 128 can receive the de-multiplexed digital samples from the digital de-multiplexer 128 and produce demodulated data to provide to the de-interleavers 130. For example, the RX DSP 128-1 can receive the de-multiplexed digital samples from the digital de-multiplexer 128 at the first data rate, de-multiplex the samples according to the subcarrier scheme, and independently demodulate the samples for each of the subcarriers from the subcarriers 118, map the processed samples of the subcarriers to produce output data, and output the data. In particular, the RX DSPs 128 can detect the subcarriers provided by the digital de-multiplexer 128 and perform a function on each of those subcarrier components. For example, the RX DSP may perform functions such as an overlap and save method, an FFT, a de-multiplexer, filtering, equalizing components, IFFT component, carrier recovery, symbols to bits, output bits, and mux component.

During 612, the receiver de-interleaves the demodulated data across the one or more path engines. For example, the de-interleaver 130 receives the bits from the RX DSPs 128 and performs systematically a de-interleaving operation on the interleaving bits performed by the transmitter 101. For example, the de-interleaver 130 de-interleaves the bits provided by the RX DSPs 128 based on the random interleaving function or the algebraic interleaving function performed by the interleaver 108 at the transmitter 101.

Additionally, the gain-sharing module 132 is spread across each of the path engines in the receiver 103. The gain-sharing module 132 seeks to undue the splitting performed by the gain-sharing module 106. In order for the gain-sharing module 132 to undue the operation performed by the gain-sharing module 106, the gain-sharing module 132 must have knowledge of the operation performed by the gain-sharing module 106. Thus, the gain-sharing module 132 can do the reverse of the operation. For example, if the gain-sharing module 106 split a block between two path engines in the transmitter 101, the gain-sharing module 132 can provide the split data on the receiver 103 side to the correct path engine.

During 614, the receiver generates output data by decoding the de-interleaved data. For example, the FEC decoder on each path engine can perform one or more decoding algorithms on the de-interleaved data provided by the gain-sharing module 132. For example, the decoding algorithms can include a Viterbi decoding algorithm, a reed-solomon decoding algorithm, or a turbo decoding algorithm. The operation performed by the FEC decoders 134 must be performed to under the encoding operation performed by the FEC encoders 104.

Embodiments of the disclosure and all of the functional operations described in this specification may be implemented in digital electronic circuitry, or in computer software, firmware, or hardware, including the structures disclosed in this specification and their structural equivalents, or in combinations of one or more of them. Embodiments of the disclosure may be implemented as one or more computer program products, i.e., one or more modules of computer program instructions encoded on a computer-readable medium for execution by, or to control the operation of, data processing apparatus. The computer readable medium may be a non-transitory computer readable storage medium, a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

To provide for interaction with a user, embodiments of the disclosure may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the disclosure may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the disclosure, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. For example, while a client application is described as accessing the delegate(s), in other implementations the delegate(s) may be employed by other applications implemented by one or more processors, such as an application executing on one or more servers. In addition, the logic flows depicted in the figures do not require the particular order shown, or sequential order, to achieve desirable results. In addition, other actions may be provided, or actions may be eliminated, from the described flows, and other components may be added to, or removed from, the described systems. Accordingly, other implementations are within the scope of the following claims.

While this specification contains many specific implementation details, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. An apparatus, comprising:
 a first digital signal processor operable to output first data at a first data rate;
 a second digital signal processor operable to output second data at a second data rate;

filter circuitry operable to receive and up-sample the first and second data;
a combiner circuit that receives the first up-sampled data and the second up-sampled data, the combiner circuit combining the first and second up-sampled data to provide a multiplexed output, the multiplexed output having a third data rate that is greater than the first data rate or the second data rate; and
a transmitter comprising:
  a plurality of path engines;
  a gain-sharing module, wherein the gain-sharing module is connected to the plurality of path engines and each path engine of the plurality of path engines comprises:
    the first digital signal processor configured to receive input data and output the first data at the first data rate; and
    a digital-to-analog converter (DAC) configured to receive the multiplexed output from the combiner circuit and output analog representations of the multiplexed output;
  the combiner circuit configured to receive the first data from the first digital signal processor and the second data from the second digital signal processor and output the multiplexed output; and
  a modulator configured to generate a modulated output based on an analog representation of the multiplexed output.

2. The apparatus of claim 1, further comprising:
a laser generating an optical signal; and
the modulator receiving the analog representation of the multiplexed output and the optical signal and modulating the optical signal based on the analog representation of the multiplexed output to generate a modulated optical signal that comprises a plurality of subcarriers.

3. The apparatus of claim 2, wherein the plurality of path engines includes a first plurality of path engines and the gain-sharing module includes a first gain-sharing module, and further comprising:
a receiver, comprising:
  a de-modulator configured to:
    receive the plurality of subcarriers at the second data rate;
    receive a local oscillator signal from a local oscillator;
    combine the local oscillator signal and the plurality of subcarriers to generate a resulting signal; and
    output the resulting signal to a detector;
  the detector configured to provide a set of voltage signals based on the resulting signal;
  a second plurality of path engines, wherein each path engine of the second plurality of path engines comprises:
    an analog-to-digital converter (ADC), each ADC configured to receive the set of voltage signals from the detector and generate, using the set of voltage signals, digital representations of signals to provide to a de-multiplexer;
    a receive digital signal processor configured to receive fourth subcarriers from the de-multiplexer at the first data rate and output digital data;
    a de-interleaver configured to receive the digital data and output de-interleaved data; and
    a forward error correction decoder configured to receive arranged de-interleaved data from a second gain-sharing module and output bit data; and
  the de-multiplexer that is configured to receive the digital representations of signals from each ADC in the plurality of second path engines and output the fourth subcarriers to each path engine of the second plurality of path engines.

4. The apparatus of claim 3, further comprising:
a second gain-sharing module that is connected to the second plurality of path engines and is configured to:
  receive the de-interleaved data output by the de-interleaver of each of the path engines of the second plurality of path engines; and
  re-arrange the de-interleaved data according to a dispersing arrangement performed by the first gain-sharing module.

5. The apparatus of claim 1, wherein each of the path engines further comprises:
a forward error correction encoder configured to receive the input data and output encoded data to the gain-sharing module; and
an interleaver configured to receive a split portion of the encoded data from the gain-sharing module and output interleaved data.

6. The apparatus of claim 5, wherein the gain-sharing module is configured to:
receive the encoded data from the forward error correction encoder from each of the path engines of the plurality of path engines: and
disperse, according to a dispersing arrangement, the encoded data across the plurality of path engines, to the interleaver of each of the path engines of the plurality of path engines.

7. The apparatus of claim 1, wherein the second data rate is a multiplicative factor of the first data rate and a number of the path engines from the plurality of path engines.

8. The apparatus of claim 7, wherein the filter circuitry is configured to up-sample each subcarrier of the first data by a number equivalent to the number of the path engines.

9. The apparatus of claim 1, wherein the combiner circuit further includes:
for each path engine in the plurality of path engines:
  an up-sampling filter configured to shape a spectrum for each subcarrier of the first data;
  a multiplier configured to multiply each subcarrier of the first data by a carrier frequency surrounding a frequency of the first data rate, such that each subcarrier of the multiplexed output occupies a non-overlapping frequency band; and
a summer configured to sum the output from each of the multipliers and output digital representations of the multiplexed output.

* * * * *